(12) United States Patent
Wang

(10) Patent No.: US 10,481,452 B2
(45) Date of Patent: Nov. 19, 2019

(54) DISPLAY PANEL

(71) Applicant: Au Optronics Corporation, Hsinchu (TW)

(72) Inventor: Zhi-Wei Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/942,384

(22) Filed: Mar. 30, 2018

(65) Prior Publication Data
US 2019/0204698 A1    Jul. 4, 2019

(30) Foreign Application Priority Data
Dec. 28, 2017    (TW) .............................. 106146277 A

(51) Int. Cl.
| G02F 1/1362 | (2006.01) |
| G02F 1/1343 | (2006.01) |
| G02F 1/1368 | (2006.01) |
| H01L 27/12 | (2006.01) |
| G02F 1/1339 | (2006.01) |
| G02F 1/1333 | (2006.01) |

(52) U.S. Cl.
CPC ...... *G02F 1/136286* (2013.01); *G02F 1/1339* (2013.01); *G02F 1/1368* (2013.01); *G02F 1/13394* (2013.01); *G02F 1/133345* (2013.01); *G02F 1/134336* (2013.01); *G02F 1/136227* (2013.01); *H01L 27/124* (2013.01); *H01L 27/1248* (2013.01); *G02F 2001/134345* (2013.01)

(58) Field of Classification Search
CPC ........... G02F 1/136286; G02F 1/13394; G02F 1/133345; G02F 1/1339; G02F 1/1368; G02F 1/134336; G02F 1/136227; G02F 2001/134345; H01L 27/1248; H01L 27/124

See application file for complete search history.

(56) References Cited

U.S. PATENT DOCUMENTS

| 8,994,042 | B2 | 3/2015 | Kang et al. |
| 9,069,204 | B2 | 6/2015 | Zhou et al. |
| 9,123,593 | B2 | 9/2015 | Kang et al. |
| 9,366,929 | B2 | 6/2016 | Kang et al. |
| 9,632,381 | B2 | 4/2017 | Kang et al. |

(Continued)

FOREIGN PATENT DOCUMENTS

| CN | 101825787 | 9/2010 |
| CN | 102981337 | 3/2013 |

(Continued)

*Primary Examiner* — David Vu
(74) *Attorney, Agent, or Firm* — JCIPRNET

(57) ABSTRACT

A display panel including a first substrate, a plurality of sub-pixels, a second substrate and a sealant. Sub-pixels are arranged into at least two lines. At least one of the sub-pixels including at least one transistor, at least one signal line, a first insulating layer, a pixel electrode and at least one auxiliary structure. The first insulating layer including at least one via hole and corresponds to the signal line. At least one auxiliary structure corresponds to at least one via hole. The auxiliary structure including at least one auxiliary electrode and at least one spacer. At least one auxiliary electrode is disposed in the at least one via hole and at least one spacer is disposed on the at least one auxiliary electrode. A pre-cutting line passes at least one of the two lines of the sub-pixels.

21 Claims, 11 Drawing Sheets

(56) References Cited

U.S. PATENT DOCUMENTS

| | | |
|---|---|---|
| 9,829,751 B2 | 11/2017 | Zhou et al. |
| 2010/0225608 A1 | 9/2010 | Zhou et al. |
| 2014/0339574 A1 | 11/2014 | Kang et al. |
| 2015/0179670 A1 | 6/2015 | Kang et al. |
| 2015/0253609 A1 | 9/2015 | Zhou et al. |
| 2015/0323848 A1 | 11/2015 | Kang et al. |
| 2016/0306248 A1 | 10/2016 | Kang et al. |
| 2017/0082888 A1 | 3/2017 | Park et al. |

FOREIGN PATENT DOCUMENTS

| | | |
|---|---|---|
| CN | 104181734 | 12/2014 |
| CN | 105223747 | 1/2016 |
| CN | 106547154 | 3/2017 |
| JP | H03110518 | 5/1991 |

DISPLAY PANEL

CROSS-REFERENCE TO RELATED APPLICATION

This application claims the priority benefit of Taiwan application serial no. 106146277, filed on Dec. 28, 2017. The entirety of the above-mentioned patent application is hereby incorporated by reference herein and made a part of this specification.

BACKGROUND

Field of the Disclosure

The disclosure is related to a panel, and particularly to a display panel.

Description of Related Art

Display panel has been commonly applied in different fields and environments. In order to enhance the aesthetic quality and achieve a particular visual effect, narrow frame technique has become the trend for development of display panel. However, generally design method for display panel does not allow for the re-sizing of the display panel or free-cutting of the display panel after completion. Even if the completed display panel can be cut freely to readjust the size of display panel, after cutting, the contact area between the circuit of the display panel and the circuit board would be too small. Thusly, the resistance between the circuit of the display panel and the circuit board is too large or the circuit board might easily come off the display panel, impacting the display function of the display panel.

SUMMARY OF THE DISCLOSURE

In an embodiment of the disclosure, a display panel includes a first substrate, a plurality of sub-pixels, a second substrate and a sealant. The plurality of sub-pixels are disposed on the first substrate, and the plurality of sub-pixels are arranged into at least two lines. At least one sub-pixel of each line includes at least one transistor, at least one signal line, a first insulating layer, a pixel electrode and at least one auxiliary structure. The at least one signal line is electrically connected to at least one transistor, wherein the signal line includes at least one of a data line, a scan line, a common electrode line and a power supply line. The first insulating layer is disposed on the at least one transistor and the signal line, and the first insulating layer has at least one via hole, wherein the at least one via hole corresponds to the signal line. The pixel electrode is disposed on the first substrate, and electrically connected to the at least one transistor. The at least one auxiliary structure is disposed on the first substrate, and electrically connected to the transistor. The at least one auxiliary structure is disposed on the first substrate, and the at least one auxiliary structure corresponds to the at least one via hole. The at least one auxiliary structure includes at least one auxiliary electrode and at least one spacer. The at least one auxiliary electrode is disposed on the first substrate, and the auxiliary electrode is at least partially disposed in the at least one via hole. The at least one spacer is disposed on the first substrate and the spacer is disposed on the at least one auxiliary electrode. The second substrate and the first substrate are disposed opposite to each other. The sealant is disposed between the first substrate and the second substrate. The display panel has a pre-cutting line, and the pre-cutting line passes through at least one of the two lines of sub-pixels.

In an embodiment of the disclosure, the at least one signal line includes a data line. The data line has a main trunk portion and an extending portion connected to the main trunk portion. The at least one via hole corresponds to the extending portion.

In an embodiment of the disclosure, the at least one auxiliary structure further includes at least one conductive structure. The conductive structure is disposed between the first substrate and the auxiliary electrode. The conductive structure and the at least one signal line are partially overlapped. The auxiliary electrode partially overlaps the conductive structure and the at least one signal line, and the via hole exposes a portion of the conductive structure and a portion of the at least one signal line respectively.

In an embodiment of the disclosure, the display panel further includes another sealant having a predetermined area. The predetermined area is disposed in the portion where the pre-cutting line passes through at least one of the two lines of sub-pixels.

In an embodiment of the disclosure, the pixel electrode further includes at least one opening. The at least one signal line includes a common electrode line, wherein the at least one opening corresponds to a portion of the at least one via hole.

In an embodiment of the disclosure, the at least one signal line includes the scan line and the common electrode line. In a direction of the pre-cutting line, the at least one auxiliary structure and the at least one via hole are respectively many. The auxiliary electrodes respectively disposed on the common electrode line and the scan line are at least partially overlapped.

In an embodiment of the disclosure, the display panel further includes at least one photo-spacer. The photo-spacer is disposed between the first substrate and the second substrate.

In an embodiment of the disclosure, a display panel includes a first substrate, a plurality of sub-pixels, a plurality of first auxiliary electrodes, a plurality of auxiliary structures, a second substrate, a sealant and a plurality of side electrodes. The plurality of sub-pixels are disposed on the first substrate. The plurality of sub-pixels are arranged into at least a first line and a second line, and the first line is disposed between the second line and a lateral surface of the first substrate. At least one sub-pixel of each of the first line and the second line includes at least one transistor, at least one first signal line and at least one second signal line, a first insulating layer and at least one pixel electrode. The at least one first signal line and the at least one second signal line are electrically connected to at least one transistor respectively. The first insulating layer is disposed on the at least one transistor and the at least one first signal line and the at least one second signal line. The first insulating layer has a plurality of via holes respectively corresponding to the at least one first signal line and the at least one second signal line. The at least one pixel electrode is disposed on the first substrate and electrically connected to the at least one transistor. The plurality of first auxiliary electrodes are disposed on at least one of the first line of sub-pixels, and the plurality of first auxiliary electrodes respectively correspond to the plurality of via holes of the at least one of the first line of sub-pixels. The plurality of auxiliary structures are disposed on the at least one of the second line of sub-pixels, and the plurality of auxiliary structures respectively correspond to the plurality of via holes of the at least one of the second line of sub-pixels. Each of the auxiliary structures includes at least one second auxiliary electrode and at least one spacer. The second auxiliary electrode is disposed on the first substrate, and the second auxiliary electrode is disposed in the corresponding via hole. The at least one spacer is disposed on the first substrate, and the spacer is disposed on the at least one second auxiliary electrode. The second substrate and the first substrate are disposed opposite to each other. The sealant is disposed between the first substrate and the second substrate, and the sealant and the plurality of first line of sub-pixels are partially overlapped. A surface of the sealant and the plurality of first auxiliary electrodes of the at least one of the first line of sub-pixels form a plurality of spaces respectively. A plurality of side electrodes are disposed on the lateral surface of the first substrate. One end of the plurality of side electrodes are respectively extended to the plurality of spaces and respectively cover the plurality of first auxiliary electrodes. Another end of the plurality of side electrodes is electrically connected to at least one circuit element.

In an embodiment of the disclosure, the at least one first signal line includes a scan line. The at least one second signal line includes at least one common electrode line.

In an embodiment of the disclosure, the pixel electrode of the at least one of each line of sub-pixel further includes at least one opening. The at least one opening is disposed on the at least one of the first line and second line of sub-pixels. The plurality of openings respectively correspond to a plurality of via holes on the plurality of second signal lines.

In an embodiment of the disclosure, the display panel further includes a plurality of conductive structures disposed between the first substrate and the plurality of first auxiliary electrodes and disposed between the first substrate and the plurality of second auxiliary electrodes. The plurality of conductive structures are partially overlapped with the at least one first signal line and the at least one second signal line of the at least one of the first line and second line of sub-pixels respectively. The plurality of the first auxiliary electrodes are respectively partially overlapped with one of the plurality of conductive structures, the first signal line and the second signal line in the at least one of the first line of sub-pixels. The plurality of second auxiliary electrodes are respectively partially overlapped with the plurality of conductive structures, the first signal line and the second signal line in the at least one of the second line of sub-pixels. The plurality of via holes respectively expose a portion of the plurality of conductive structures, a portion of the first signal line and a portion of the second signal line.

In an embodiment of the disclosure, the at least one of each line of sub-pixel further includes at least one third signal line. The plurality of via holes further respectively correspond to the plurality of third signal lines.

In an embodiment of the disclosure, the at least one third signal line includes a data line.

In an embodiment of the disclosure, the display panel further includes a plurality of conductive structures being disposed between the first substrate and the plurality of first auxiliary electrodes and disposed between the first substrate and the second auxiliary electrodes. The conductive structures are partially overlapped with the third signal line disposed on the at least one sub-pixels of the first line and the second line respectively. One of the first auxiliary electrodes are partially overlapped with one of the conductive structures and the third signal line in the at least one sub-pixels of the first line. One of the second auxiliary electrode are partially overlapped with one of the conductive structures and the third signal line in the at least one sub-pixels of the second line. The via holes respectively expose a portion of the plurality of conductive structures and a portion of the third signal line.

In an embodiment of the disclosure, each of the third signal lines has a main trunk portion and an extending portion connected to the main trunk portion. The plurality of via holes respectively correspond to a plurality of extending portions.

In an embodiment of the disclosure, the display panel further includes at least one photo-spacer. The photo-spacer is disposed between the first substrate and the second substrate.

In an embodiment of the disclosure, a display panel includes a first substrate, a plurality of sub-pixels, at least one first auxiliary electrodes, at least one auxiliary structure, a second substrate, a sealant and at least one side electrode. The plurality of sub-pixels are disposed on the first substrate and arranged into at least one first line and a second line. The first line is disposed between the second line and a lateral surface of the first substrate. At least one sub-pixel of each of the first line and the second line includes at least one transistor, at least one signal line, a first insulating layer and at least one pixel electrode. The at least one signal line is electrically connected to the at least one transistor. The signal line includes one of a data line, a scan line, a common electrode line and a power supply line. The first insulating layer is disposed on the at least one transistor and the signal line. The first insulating layer has at least one via hole corresponding to the signal line. The at least one pixel electrode is disposed on the first substrate and electrically connected to the at least one transistor. The at least one first auxiliary electrode is disposed on the at least one of the first line of sub-pixels, and the at least one first auxiliary electrode corresponds to the at least one via hole of the at least one of the first line of sub-pixels. The at least one auxiliary structure is disposed on the at least one of the second line of sub-pixel, and the at least one auxiliary structure corresponds to the at least one via hole of the at least one of the second line of sub-pixel. The at least one auxiliary structure includes at least one second auxiliary structure and the at least one spacer. The at least one second auxiliary electrode is disposed on the first substrate, and the second auxiliary electrode is disposed in the corresponding via hole. The at least one spacer is disposed on the first substrate, and the spacer is disposed on the at least one second auxiliary electrode. The second substrate and the first substrate are disposed opposite to each other. The sealant is disposed between the first substrate and the second substrate, and the sealant is partially overlapped with plurality of the first line of sub-pixels, and a surface of the sealant and the at least one first auxiliary electrode of the at least one of the first line of sub-pixels form a space. The at least one side electrode is disposed on the lateral surface of the first substrate. An end of the side electrode is extended to the space and covers the first auxiliary electrode, and another end of the side electrode is electrically connected to at least one circuit element.

In an embodiment of the disclosure, the at least one signal line includes a data line.

In an embodiment of the disclosure, the display panel further includes a plurality of conductive structures being disposed between the first substrate and the first auxiliary electrode and being disposed between the first substrate and the second auxiliary electrode. The conductive structures are partially overlapped with the signal line of the at least one sub-pixels in the first line and the second line respectively. The first auxiliary electrode is partially overlapped with one of the conductive structures and the signal line in the at least one sub-pixel of the first line. The second auxiliary electrode is partially overlapped with one of the conductive structures and the signal line in the at least one sub-pixel of the second line. The via holes expose a portion of the conductive structures and a portion of the signal line respectively.

In an embodiment of the disclosure, each of the signal lines has a main trunk portion and an extending portion connected to the main trunk portion. The plurality of via holes respectively correspond to the plurality of extending portions.

In an embodiment of the disclosure, the display panel further includes at least one photo-spacer. The photo-spacer is disposed between the first substrate and the second substrate.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1A:
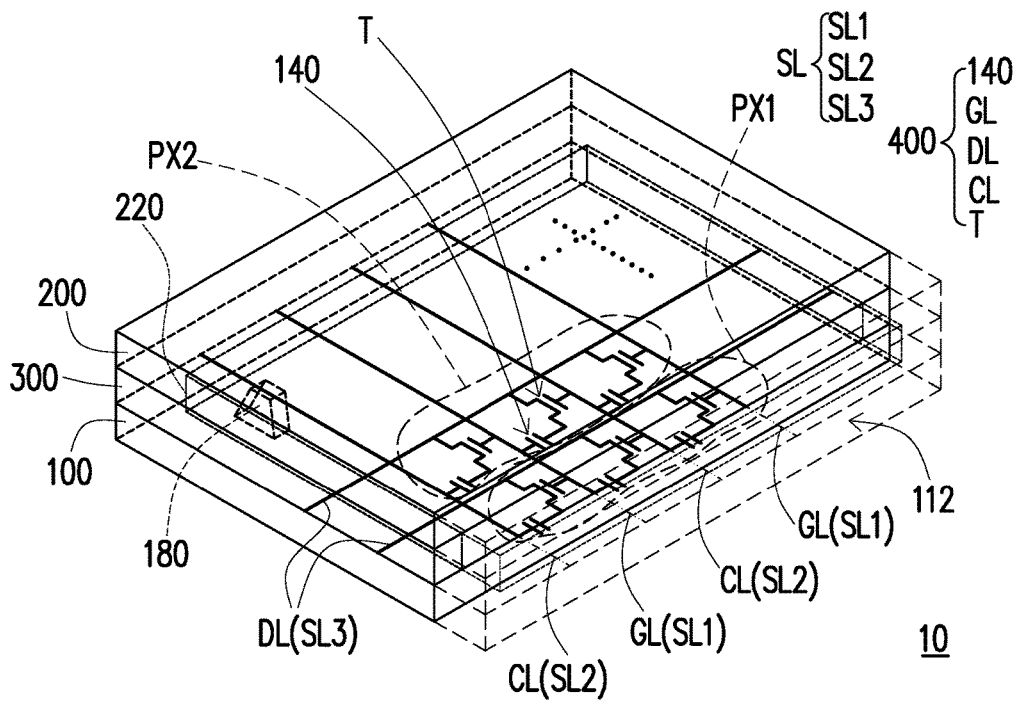
FIG. 1A is a perspective view illustrating a display panel according to an embodiment of the disclosure.

In the drawings, in order to show the illustrations clearly, the thickness of layers, films, panels and regions are exaggerated. Throughout the specification, the same reference numeral denotes the same element. It should be understood that when it is described that an element on the layer, film, region or substrate is "on" another element or "connected to" another element, it can be either directly on another element or connected to another element; alternatively, an intervening element may be present. On the contrary, when it is described that an element is "directly on another element" or "directly connected to" another element, no intervening element is present there. As described in the present text, "connected to" or "coupled to" may refer to physical and/or electrical connection. Alternatively, "electrically connected" or "coupled to" may refer to that there is another element existed between two elements.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the disclosure and is not a limitation on the scope of the disclosure unless otherwise specified. Further, unless defined otherwise, all terms defined in generally used dictionaries may not be overly interpreted.

The terminology used herein is for the purpose of describing particular embodiments and is not intended to be limiting of the disclosure. As used herein, the singular forms "a," "an" and "the" are intended to include the plural forms as well, including "at least one", unless the context clearly indicates otherwise.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

Figure 2A:
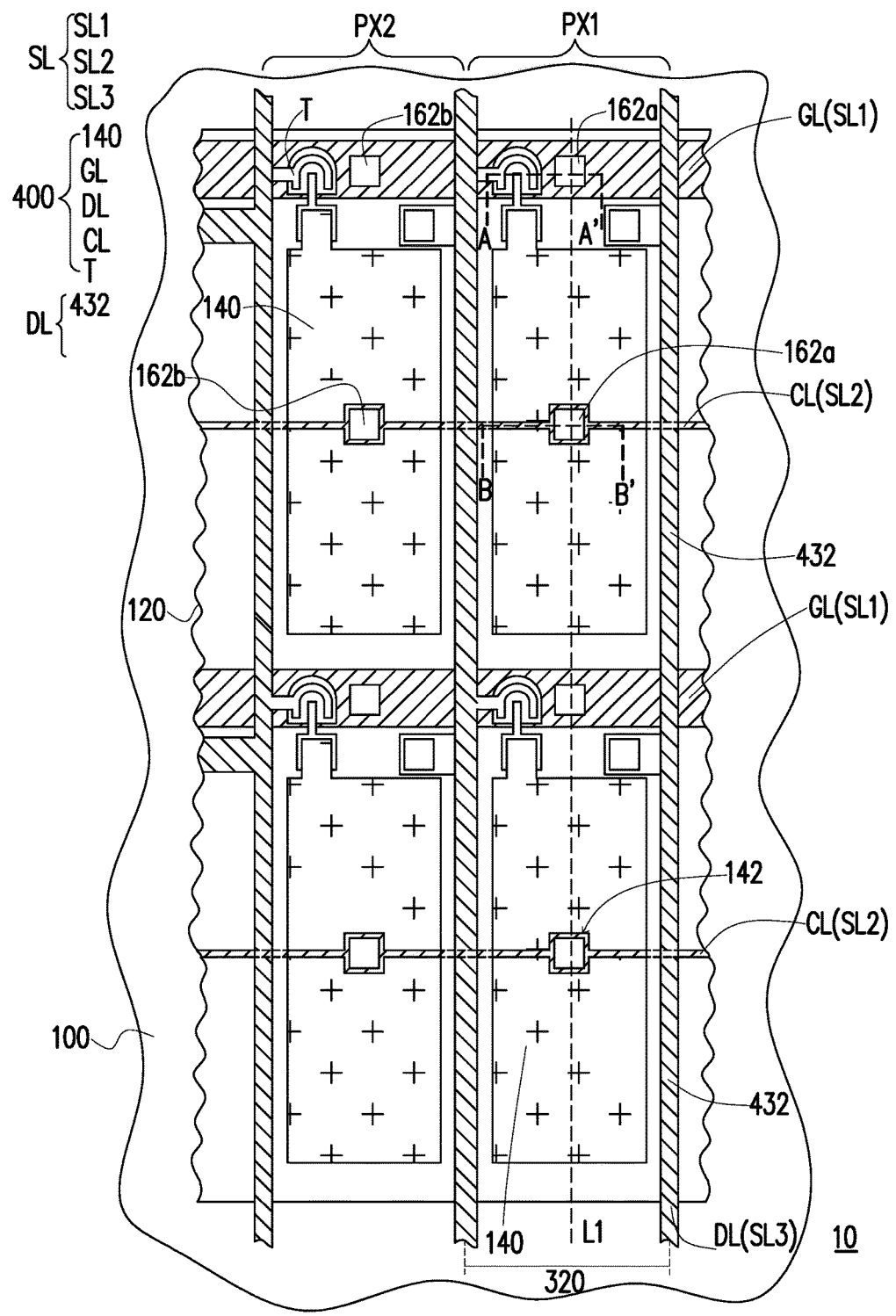
FIG. 2A is a schematic top view illustrating a display panel according to an embodiment of the disclosure.
Figure 2B:
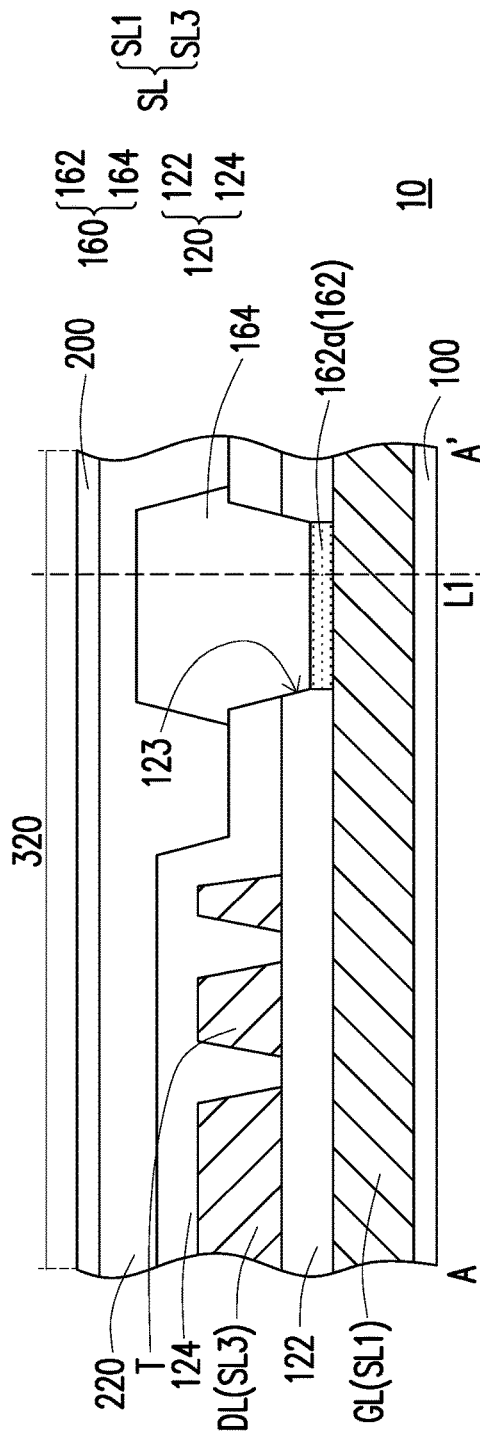
FIG. 2B is a partial sectional view illustrating the display panel in FIG. 2A taken along line A-A' before cutting.
Figure 2C:
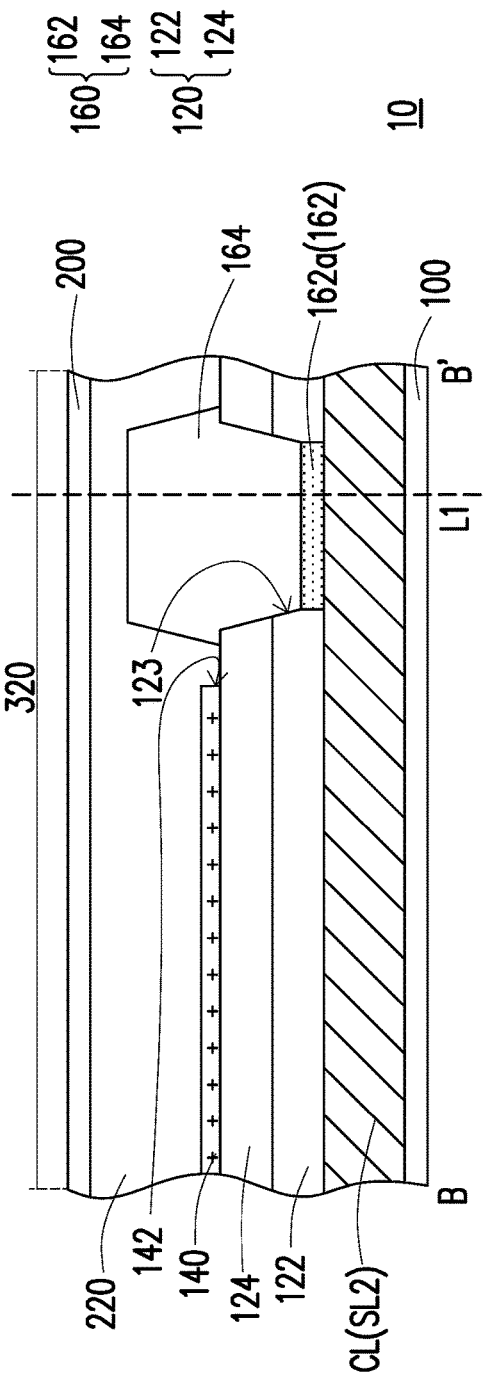
FIG. 2C is a partial sectional view illustrating the display panel in FIG. 2A taken along line B-B' before cutting.

FIG. 1A is a perspective view illustrating a display panel according to an embodiment of the disclosure. FIG. 2A is a schematic top view illustrating a display panel according to an embodiment of the disclosure. FIG. 2B is a partial sectional view illustrating the display panel in FIG. 2A taken along line A-A' before cutting. FIG. 2C is a partial sectional view illustrating the display panel in FIG. 2A taken along line B-B' before cutting. Referring to FIG. 1A and FIG. 2A, in the embodiment, a display panel 10 includes a first substrate 100, a plurality of sub-pixels 400, a second substrate 200 and a sealant 300. The display panel 10 of the disclosure further includes a photo-spacer 180 disposed between the first substrate 100 and the second substrate 200 (only one photo-spacer 180 is shown in FIG. 1A for exemplary purpose, which should not be construed as a limitation to the disclosure). Additionally, in order to show the relationship between the element and the position thereof clearly, the shape, size and number of the elements shown in FIG. 1A may be exaggerated and not to be similar to the actual element.

As shown in FIG. 1A and FIG. 2A, the display panel 10 of the embodiment includes the first substrate 100, the second substrate 200 opposite to the first substrate 100 and a display medium layer 220, e.g., a liquid crystal layer, optionally disposed between the first substrate 100 and the second substrate 200, but the disclosure is not limited thereto. The display medium layer 220 (e.g., liquid crystal layer) that is optionally disposed includes liquid crystal molecules that can be in-plane-rotating or in-plane-switching or liquid crystal molecules that can be vertical rotating or vertical switching; however, the disclosure is not limited thereto. Additionally, an electrode (not shown) may be optionally disposed on the second substrate 200, which should not be construed as a limitation to the disclosure. In other embodiment, the display medium layer 220 of the display panel 10 may be a self-luminous material (e.g., organic material, inorganic material, quantum dot or bar, perovskite and a derivative thereof, or other suitable material); alternatively, the display medium layer 220 may be other non-self-luminous material (i.e., electrophoresis, electro-wetting, electrical-dust or other suitable material) without using liquid crystal.

In the embodiment, the plurality of sub-pixels 400 are disposed on the first substrate 100, and the plurality of sub-pixels 400 are arranged into at least two lines of sub-pixels PX1 and PX2 (e.g., may also be referred to as the first line of sub-pixels PX1 and the second line of sub-pixels PX2). At least one sub-pixel 400 in each line of the sub-pixels PX1 and PX2 at least includes at least one transistor T, at least one signal line SL, a first insulating layer 120, at least one pixel electrode 140 and at least one auxiliary structure (shown in FIG. 2B and FIG. 2C). If the at least one signal line SL has a plurality of signal lines, it may include a signal line SL1 (or referred to as a first signal line), a signal line SL2 (or referred to as a second signal line), a signal line SL3 (or referred to as a third signal line) and a signal line (or referred to as a fourth signal line, not shown) that can be deduced from the above. For example, the plurality of signal lines SL (e.g., signal line SL1, signal line SL2, signal line SL3 or other signal line (not shown)) may include at least one of a data line DL, a scan line GL, a common electrode line CL, a power supply line (not shown), or other suitable line, or one of the lines described above. The signal line SL may be arranged on the first substrate 100, and the signal line SL3 (e.g., data line DL) and the signal line SL1 (e.g., scan line GL) may be disposed in an interlaced manner. Additionally, the signal line L3 (e.g., data line DL) and the signal line SL1 (e.g., scan line GL) may belong to different layers, which should not be construed as a limitation to the disclosure. Additionally, as shown in FIG. 1A, the signal line SL of the sub-pixel 400 may optionally further include the signal line SL2 (e.g., common electrode line CL) disposed between two adjacent signal lines SL1 (e.g., scan line GL), and may be substantially parallel with the signal line SL1 (e.g., scan line GL) and interlaced with the signal line SL3 (e.g., data line DL), which should not be construed as a limitation to the disclosure.

As shown in FIG. 1A, the transistor T may be respectively disposed on the first substrate 100 and disposed on the position where the plurality of signal lines SL are interlaced with each other. For example, the transistor T may be disposed on the position where the two signal lines SL3 and SL1 (e.g., data line DL and scan line GL) are interlaced with each other, and respectively electrically connected to the two signal lines SL3 and SL1 (e.g., data line DL and scan line GL). In the embodiment, the transistor T is, for example, a thin film transistor (TFT), which may include a bottom-gate transistor, a top-gate transistor, a vertical transistor (vertical TFT) or other suitable transistor, the disclosure is not limited thereto. The transistor T may be arranged on the first substrate 100 in matrix, and respectively electrically connected to at least one corresponding signal line SL3 (e.g., data line DL) or at least one corresponding signal line SL1 (e.g., scan line GL).

Figure 1B:
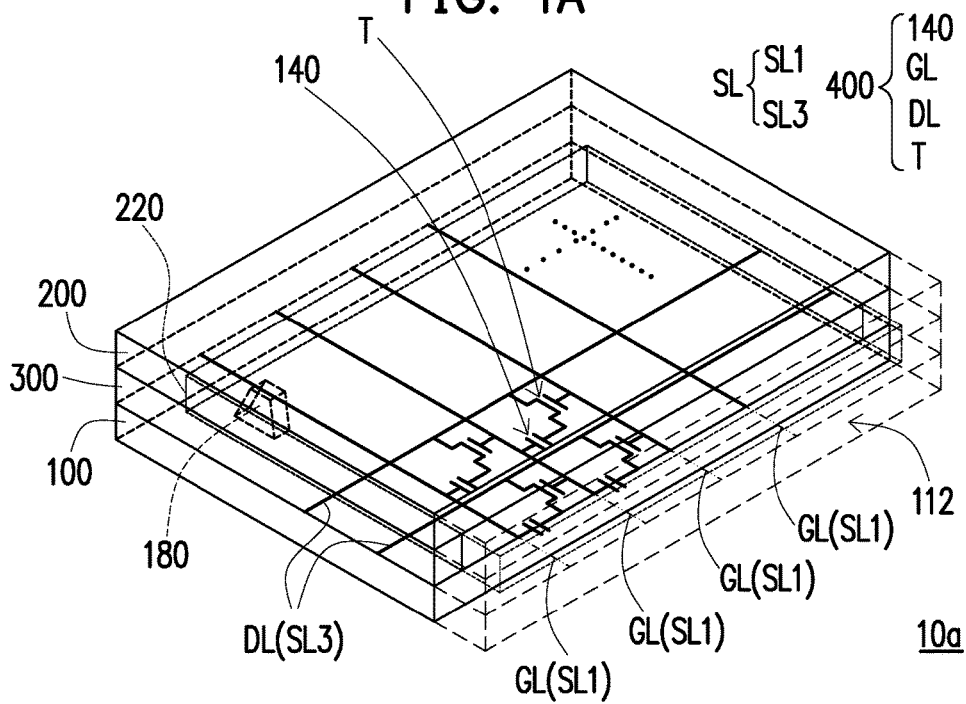
FIG. 1B is a perspective view illustrating a display panel according to another embodiment of the disclosure.

In the embodiment, the transistor T may be selectively electrically connected to at least one signal line SL2 (e.g., common electrode line CL). For example, the transistor T is electrically connected to at least one signal line SL2 (e.g., common electrode line CL) by the means of capacitor coupling. Viewing from another perspective, a storage capacitor of the sub-pixel 400 in the embodiment may be disposed between the transistor T and the at least one signal line SL2 (e.g., common electrode line CL), and the storage capacitor may be constructed by the pixel electrode 140 and the common electrode line CL partially overlapped with each other, which may be referred to as a Cst on common line manner (e.g., FIG. 1A), but the disclosure is not limited thereto. In other embodiment, the storage capacitor of the display panel 10a may be constructed by the pixel electrode 140 and the at least one signal line SL1 (e.g., scan line GL) partially overlapped with each other, which may be referred to as a Cst on scan line manner (e.g., FIG. 1B), or a combination of the aforementioned storage capacitors. Additionally, FIG. 1A and related descriptions may serve as reference for the embodiment of FIG. 1B, and thus no repetition is incorporated herein.

Referring to FIG. 1A, FIG. 2A and FIG. 2B, in the embodiment, a first insulating layer 120 is formed on the first substrate 100. In some embodiments, the first insulating layer 120 may be disposed on the transistor T and the signal line SL, and the first insulating layer 120 has at least one via hole 123. The at least one via hole 123 is substantially disposed in corresponding to the signal line SL (e.g., signal line SL1). For example, the first insulating layer 120 may be disposed on the signal line SL1 (e.g., scan line GL) and/or transistor T; alternatively, the first insulating layer 120 may be overlapped with the signal line SL1 (e.g., scan line GL) and/or the transistor T, and can be designed to have single layer or double layer. As shown in FIG. 2B, the first insulating layer 120 in the embodiment has double layer, wherein the first insulating layer 120 may include a first sub-insulating layer 122 and a second sub-insulating layer 124. The first insulating layer 122 may serve as a gate insulating layer of the transistor T and cover the signal line SL1 (e.g., scan line GL), and the second sub-insulating layer 124 may serve as a protecting layer that covers the transistor T, which should not be construed as a limitation to the disclosure. In other embodiment, the first insulating layer 120 may only include the first sub-insulating layer 122 to protect the signal line SL (e.g., signal line SL). Alternatively, the first insulating layer 120 may only include the second sub-insulating layer 124 to protect the transistor T. Additionally, the material of the first insulating layer 120 may be an inorganic material, an organic material or a combination thereof.

Referring to FIG. 2A, FIG. 2B and FIG. 2C, in the embodiment, the first insulating layer 120 may be disposed on the plurality of signal lines SL1 and SL2 (e.g., scan line GL and common electrode line CL), and the plurality of via holes 123 respectively correspond to the plurality of signal lines SL1 and SL2 (e.g., scan line GL and common electrode line CL) to expose a portion of surface of the plurality of signal lines SL1 and SL2 (e.g., scan line GL and common electrode line CL).

In the embodiment, the at least two signal lines SL (e.g., at least one signal line SL1 and at least one signal line SL2) may be respectively electrically connected to the transistor T. The signal line SL1 is, for example, a scan line GL, and the signal line SL2 is, for example, a common electrode line CL, which should not be construed as a limitation to the disclosure. At least one pixel electrode 140 is disposed on the first substrate 100, and the pixel electrode 140 is electrically connected to the transistor T, thereby completing configuration of the sub-pixel 400. In some embodiments, the first insulating layer 120 may be disposed between the pixel electrode 140 and the first substrate 100 (as shown in FIG. 2C for example); however, the disclosure is not limited thereto. In other embodiments, the pixel electrode 140 may be disposed between the first insulating layer 120 and the first substrate 100.

As shown in FIG. 2A, FIG. 2B and FIG. 2C, the display panel 10 further has a pre-cutting line L1, and the pre-cutting line L1 passes through at least one line of the sub-pixel 400 of among the two lines of sub-pixels PX1 and PX2, for example: the sub-pixel 400 of the line of sub-pixel PX1 (or referred to as sub-pixel 400 of the first line of sub-pixel PX1), which should not be construed as a limitation to the disclosure. In the embodiment, it is possible to dispose the sealant 300 in the sealant predetermined area (not shown) between the first substrate 100 and the second substrate 200 having a plurality of sub-pixels 400 to joint the first substrate 100 and the second substrate 200 having a plurality of sub-pixels 400. Furthermore, in the embodiment, in order to freely cut the display panel 10 to readjust the size (e.g., re-sizing) of the display panel 10, the display panel 10 may be further be provided with another sealant predetermined area 320 between the first substrate 100 and the second substrate 200, and said another sealant predetermined area 320 may be disposed in a portion where the pre-cutting line L1 passes through at least one line of the sub-pixel 400 among the two lines of the sub-pixels PX1 and PX2, for example, the line of sub-pixel PX1 (or referred to as the first line of sub-pixel PX1) to allow the sealant 300 to be disposed on the display panel 10 that is cut for readjusting the size of the display panel 10, such that the display medium layer (e.g., liquid crystal layer, not shown) of the display panel 10 that is cut for readjusting the size of the display panel 10 can still be disposed in the region (or referred to as the display area having the plurality of sub-pixels 400) defined between the first substrate 100 and the second substrate 200 of the sealant 300.

In the embodiment, the sub-pixel 400 further includes at last one auxiliary structure 160. The at least one auxiliary structure 160 is disposed on the first substrate 100, and the at least one auxiliary structure 160 corresponds to the at least one via hole 123. For example, the at least one auxiliary structure 160 includes at least one auxiliary electrode 162 and at least one spacer 164. The at least one auxiliary electrode 162 is disposed on the first substrate 100, and at least a portion of the auxiliary electrode 162 is disposed in the at least one via hole 123. The auxiliary electrode 162 may be disposed on at least one signal line SL exposed by the via hole 123 to protect the at least one signal line SL, and serve the purpose for at least one signal line SL to be electrically connected to other electronic element (not shown). The auxiliary electrode 162 may be disposed on at least one of the signal lines SL exposed by the via hole 123. More preferably, the auxiliary electrode 162 may be disposed on the plurality of signal lines SL exposed by the plurality of via holes 123. In the embodiment, the auxiliary electrode 162 may be a single-layer or multi-layer structure, and the material thereof is, for example, a transparent conductive layer (e.g., indium-tin oxide, indium-zinc oxide, aluminum-zinc oxide, indium-germanium-zinc oxide or other suitable material), a reflective conductive layer, or other suitable material, which should not be construed as a limitation to the disclosure. In the embodiment, the auxiliary electrode 162 is exemplified using the material of the pixel electrode 140, which should not be construed as a limitation to the disclosure.

Additionally, at least one spacer 164 may be disposed on the first substrate 100, and the spacer 164 may be disposed on the at least one auxiliary electrode 162. For example, in the embodiment, at least a portion of the spacer 164 may be disposed in the via hole 123, and the spacer 164 may cover the auxiliary electrode 162. The material of the spacer 164 may be, for example, a photoresist material, and the spacer 164 may be removed by fluid (e.g., acid solution (not shown), which may include photoresist etching solution or other suitable solution) to expose the auxiliary electrode 162. Since at least a portion of the auxiliary electrode 162 is disposed in the via hole 123 that exposes the at least one signal line SL (e.g., at least one of the signal lines SL1, SL2 and SL3), the exposed auxiliary electrode 162 may effectively increase the contact area of the at least one signal line SL (e.g., at least one of the signal lines SL1, SL2 and SL3) to include a sectional area of the at least one signal line SL on the lateral surface 112 and auxiliary electrode 162, thereby reducing the resistance of the circuit element (not shown in FIG. 2A) which is electrically connected to the at least one signal line SL (e.g., at least one of signal line SL1, SL2, SL3).

Figure 3A:
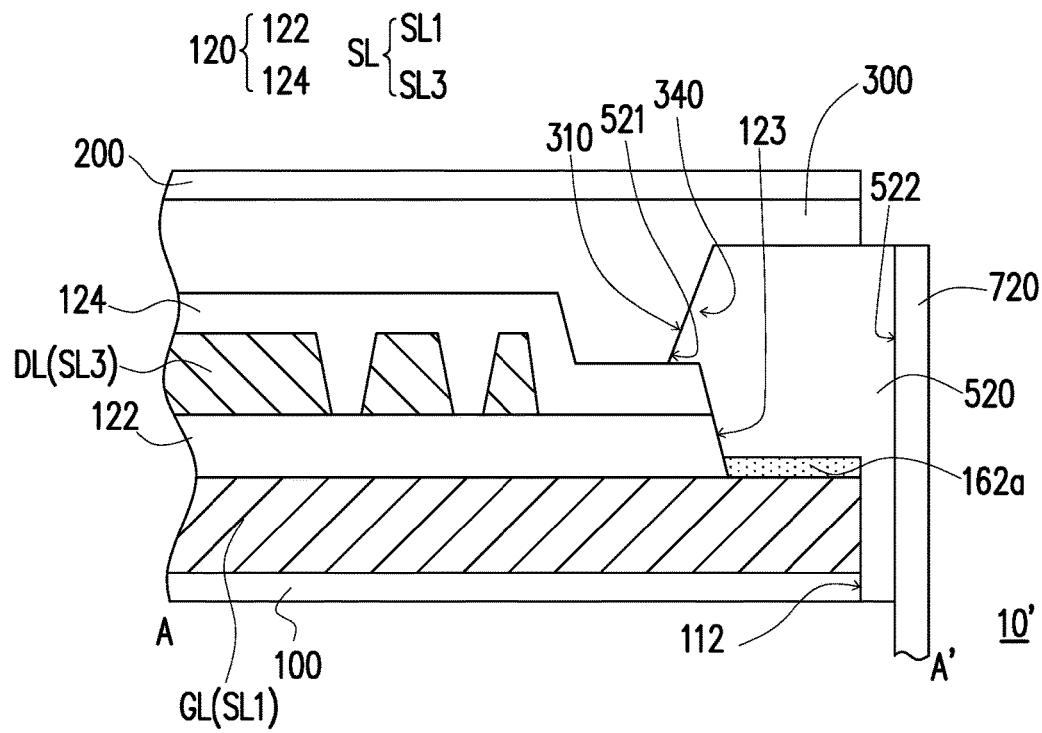
FIG. 3A is a partial sectional view illustrating the display panel in FIG. 2A taken along line A-A' after cutting.
Figure 3B:
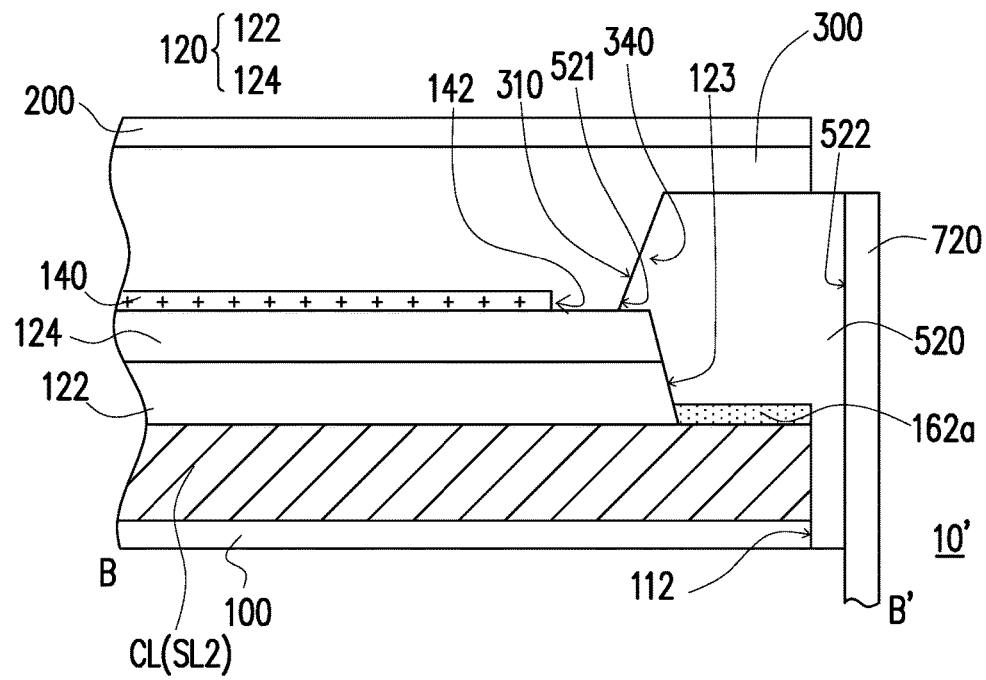
FIG. 3B is a partial sectional view illustrating the display panel in FIG. 2A taken along line B-B' after cutting.

FIG. 3A is a partial sectional view illustrating the display panel in FIG. 2A taken along line A-A' after cutting. FIG. 3B is a partial sectional view illustrating the display panel in FIG. 2A taken along line B-B' after cutting. Referring to FIG. 1A, FIG. 2A, FIG. 2B, FIG. 2C, FIG. 3A and FIG. 3B, in the embodiment, the plurality of sub-pixels 400 are disposed on the first substrate 100, and the sub-pixels 400 are arranged into at least one first line of sub-pixels PX1 and at least one second line of sub-pixels PX2. The first line of sub-pixels PX1 is disposed between the second line of sub-pixels PX2 and the lateral surface 112 (or referred to as a cutting surface) of the first substrate 100. Therefore, when the display panel 10 in FIG. 1A is not further adjusted in size (i.e., the display panel 10 that is completed), the drawing of the display panel 10 includes a portion illustrated with solid line (e.g., left portion) and a portion illustrated with dashed line (e.g., right portion). When the display panel 10 is further readjusted in size, the drawing of the display panel 10 only includes the portion illustrated with solid line (e.g., left portion), and the portion illustrated with dashed line (e.g., right portion) is regarded as the portion that is removed after the display panel 10 is being free-cut. In other embodiments, it is possible to determine the portion (portion illustrated with dashed line) to be removed when the display panel 10 is further to be readjusted in size based on the position to be retained, e.g., the left portion, the lower portion, the upper portion, a portion of the middle portion, or other suitable portion, or a combination of at least two of the above.

In FIG. 2B and FIG. 2C, the display panel 10 before cutting is cut along the pre-cutting line L1 via the re-sizing process, and then formed into a display panel 10' after cutting as shown in FIG. 3A and FIG. 3B. Referring to FIG. 2A, FIG. 3A and FIG. 3B, in the embodiment, since the first line of sub-pixel PX1 is disposed along the pre-cutting line L1, when the above-mentioned re-sizing process is performed, a cutting tool (e.g., knife (not shown), laser (not shown), or other suitable tools, or a combination thereof) may be used to cut the display panel 10 along the pre-cutting lien L1. For example, before the re-sizing process is performed, the display medium layer 220 is disposed between the first substrate 100 and the second substrate 200. Thereafter, the re-sizing process is performed by re-cutting the display panel 10 along the pre-cutting line L1, and then a lateral surface 112 (e.g., cutting surface) is cut from the display panel 10 or 10a to fill the sealant 300 in another sealant predetermined area 320 to avoid that the display medium layer 220 (e.g., liquid crystal) from being reduced (e.g., flow away) in the process and consequently affecting the display quality of the display panel 10. In some embodiments, before the sealant 300 is filled in said another sealant predetermined area 320, a pressure may be applied near the cutting position on the display panel after cutting (e.g., by pressing the cutting position on the display panel after cutting or other suitable approach), which may make it less likely to lose (e.g., flow away) the display medium layer 220 (e.g., liquid crystal) at the cutting position on the display panel after cutting. Thereafter, the lateral surface 112 (e.g., cutting surface) cut from the display panel 10 is removed (e.g., polished or other suitable approach) to expose the conductive layer or at last one signal line SL (e.g., one of signal line SL1, SL2, SL3) from the lateral surface 112 (e.g., cutting surface). Based on the above, the edge of the display panel 10 can be cut and removed such that the size of the frame region (e.g., non-display area) can be reduced.

In the embodiment, the illustrations from the process of removing (e.g., polishing) the display panel via the removing (e.g., polishing) process (not shown) to exposing the at least one signal line SL (e.g., signal line SL1 and/or signal line SL2) are presented for schematic purpose, which should not be construed as a limitation to the disclosure. After removing (e.g., polishing), the sectional surface of the signal line SL may be substantially aligned with the lateral surface 112 of the first substrate 100, which should not be construed as a limitation to the disclosure. In other embodiments, the signal line SL may be retracted to be within the lateral surface 112, and the sectional surface of the signal line SL may not be aligned with the lateral surface 112 of the first substrate 100.

In the embodiment, since the pre-cutting line L1 simultaneously passes through a plurality of signal lines SL (e.g., signal line SL1 and signal line SL2 or all of them are signal lines SL1), after cutting, at least one signal line SL1 and at least one signal line SL2 or all of signal lines SL1 can be exposed. Based on the above, it is possible to dispose the plurality of auxiliary structures 160 to be partially overlapped with the pre-cutting line L1. For example, the at least one auxiliary structure 160 may be correspondingly disposed on the at least one signal line SL (e.g., signal line SL and/or signal line SL2), such that the auxiliary structure 160 may correspond to the signal line SL (e.g., signal line SL1 and/or signal line SL2) exposed by the via hole 123. Viewing from another perspective, if the plurality of auxiliary structures 160 may be respectively disposed on the plurality of signal lines SL (e.g., signal line SL1, signal line SL2, or other suitable line) correspondingly, the plurality of (e.g., two) auxiliary structures 160 may be respectively disposed on the plurality of signal lines SL (e.g., signal line SL1 and/or signal line SL2) exposed by the plurality of (e.g., two) via holes 123. In some embodiments, the pixel electrode 140 may further selectively include at least one opening 142. For example, the at least one signal line SL2 (e.g., common electrode line CL) and the at least one opening 142 correspond to the at least one via hole 123. The at least one opening 142 exposes a surface of a portion of the first insulating layer 120, the at least one via hole 123 and at least one auxiliary structure 160 disposed in the via hole 123, and makes the pixel electrode 140 to be separated from the auxiliary structure 160. Viewing from another perspective, the plurality of auxiliary structures along the direction of the pre-cutting line L1 may be respectively disposed on the signal line SL2 (e.g., common electrode line CL) and the signal line SL1 (e.g., scan line GL), and the pre-cutting line L1 and the plurality of auxiliary structures 160 are at least partially overlapped. Based on the above, when the cutting process is to be performed along the same pre-cutting line L1, it is possible to cut the plurality of auxiliary structures 160 simultaneously to expose the plurality of auxiliary structures 160 from the lateral surface 112 of the first substrate 100, thereby effectively simplifying manufacturing process and reducing the cost for cutting.

Thereafter, a method of using fluid for removing (e.g., acid solution etching) may be applied to the display panel 10' to remove the spacer 164 from the first line of the sub-pixel PX1, which should not be construed as a limitation to the disclosure. In other embodiments, the spacer 164 may be removed via other removing method (e.g., plasma etching or reactive ion etching). At this time, a first auxiliary electrode 162a corresponding to the via hole 123 is exposed, and a portion of the surface 310 of the sealant 300 (e.g., partial lower surface of sealant 300) and the first auxiliary electrode 162a of the at least one sub-pixel 400 in the first line of sub-pixel PX1 may form a plurality of spaces 340 respectively. In some embodiments, the space 340 may also include a portion of the via hole 123, which should not be construed as a limitation to the disclosure. Viewing from another perspective, the signal line SL of the sub-pixel 400 not only can expose the sectional surface from the lateral surface 112 of the first substrate 100 after cutting and removing (e.g., polishing), but also can expose the signal line SL after the spacer 164 is removed via the removing process (e.g., etching process), thereby effectively increasing the contact area of the signal line SL.

Thereafter, as shown in FIG. 3A and FIG. 3B, a plurality of side electrodes 520 are disposed on the lateral surface 112 of the first substrate 100. One end 521 (or namely one portion) of the side electrode 520 is extended to the space 340 and covers the first auxiliary electrode 162a. The side electrode 520 may be a mixture of a conductive object having conducting function and the sealant, such as a silver paste or other suitable conductive object, which should not be construed as a limitation to the disclosure. For example, the silver paste may be formed (via coating or other suitable approach) on the lateral surface 112 of the first substrate 100 and filled into the space 340; thereafter, it is optional to form the side electrode 520 via a curing process. Another end 522 (or namely another portion) of the side electrode 520 may be electrically connected to a contact electrode 720 of at least one circuit element 700 (shown in FIG. 5).

Since the auxiliary structure 160 of the sub-pixel 400 in the embodiment has the spacer 164 and the auxiliary electrode 162 corresponding to the via hole 123, when the re-sizing process is performed, after one of the sub-pixel in the at least two lines of sub-pixels (e.g., sub-pixel 400 in the first line of sub-pixel PX1) is cut, a fluid (e.g., acid solution) etching process may be performed to remove the spacer 164, and the portion of the signal line SL only exposed by the via hole 123, the first auxiliary electrode 162a corresponding to the signal line SL and the space 340 disposed between the sealant 300 and the first auxiliary electrode 162a are retained. In this manner, the side electrode 520 can be filled in the space 340 and cover the first auxiliary electrode 162a to be electrically connect the signal line SL to the circuit element 700 (shown in FIG. 5). Additionally, in the disclosure, the signal line SL and the side electrode 520 can be electrically connected after the display panel 10 is cut without providing an additional electrode element, and thus the cutting flexibility of the re-sizing process can be increased. Based on the above, the configuration described in the embodiment effectively increases the cutting flexibility of the display panel 10, increases the contact area of the signal line SL and reducing the resistance of the signal line SL connected with an external electronic element.

Referring to FIG. 2A, FIG. 2B and FIG. 2C, in the embodiment, the at least one sub-pixel 400 in the second line of sub-pixels PX2 on the display panel 10' after cutting is similar to the display panel 10 before cutting, and the difference is that the plurality of auxiliary structures 160 are disposed on the at least one sub-pixel 400 in the second line of sub-pixels PX2, and the auxiliary structure 160 includes a second auxiliary electrode 162b disposed on the first substrate 100 and corresponds to the via hole 123, and the spacer 164 is correspondingly disposed on the second auxiliary electrode 162b (not shown). Additionally, the sealant 300 may not be overlapped with the at least one sub-pixel 400 in the second line of sub-pixel PX2. From another perspective, the difference between the second line of sub-pixels PX2 and the first line of sub-pixels PX1 is that the second line of sub-pixels PX2 do not undergo the re-sizing process, and the spacer 164 is not removed via etching, so the complete auxiliary structure 160 can be retained to correspond to the via hole 123. Therefore, the second line of sub-pixels PX2 still have the display medium layer 220 to serve the display frame (or namely display image), and the first line of sub-pixels PX1 do not serve as the display frame.

Figure 4A:
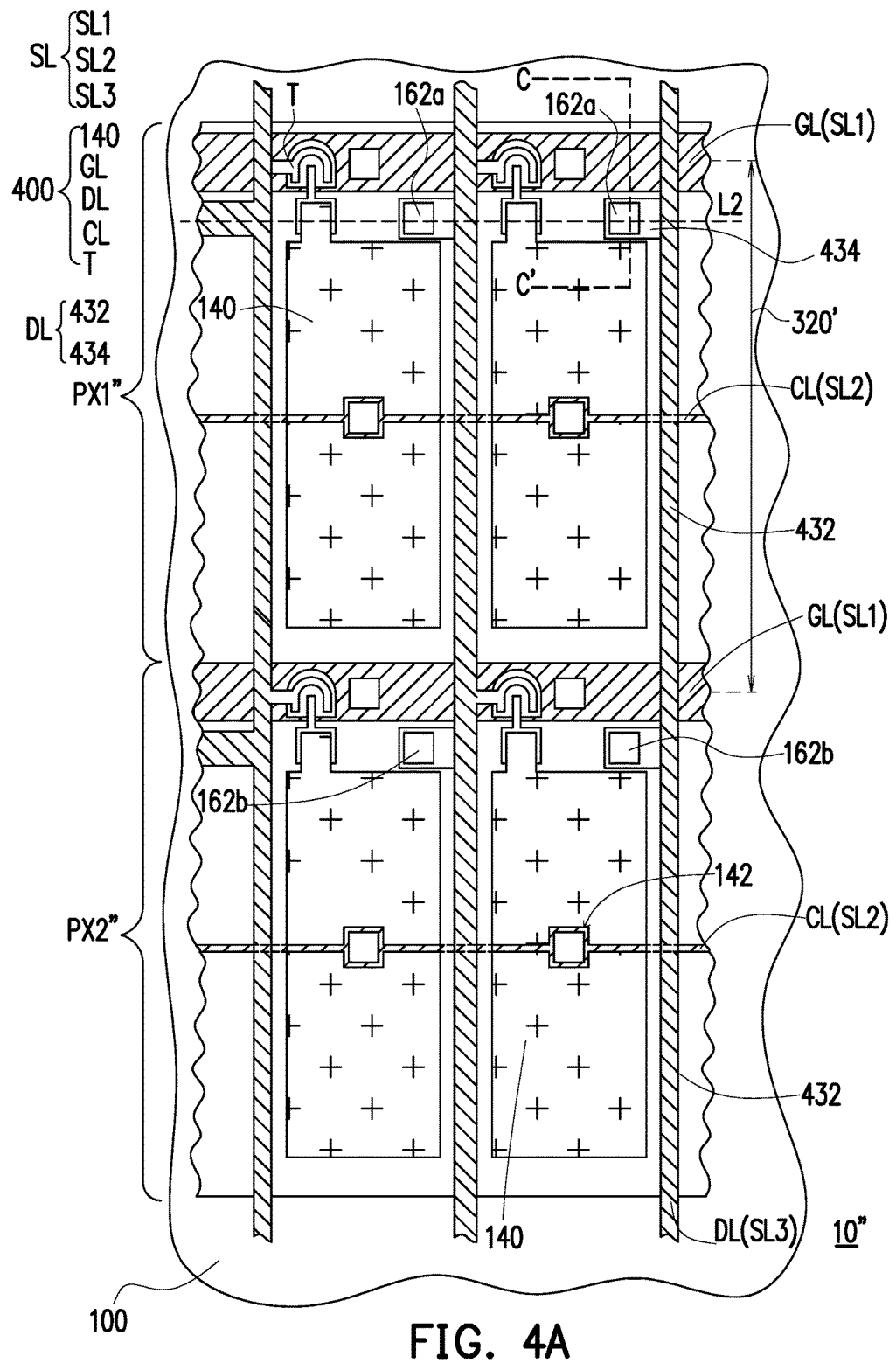
FIG. 4A is a schematic top view illustrating a display panel according to another embodiment of the disclosure.
Figure 4B:
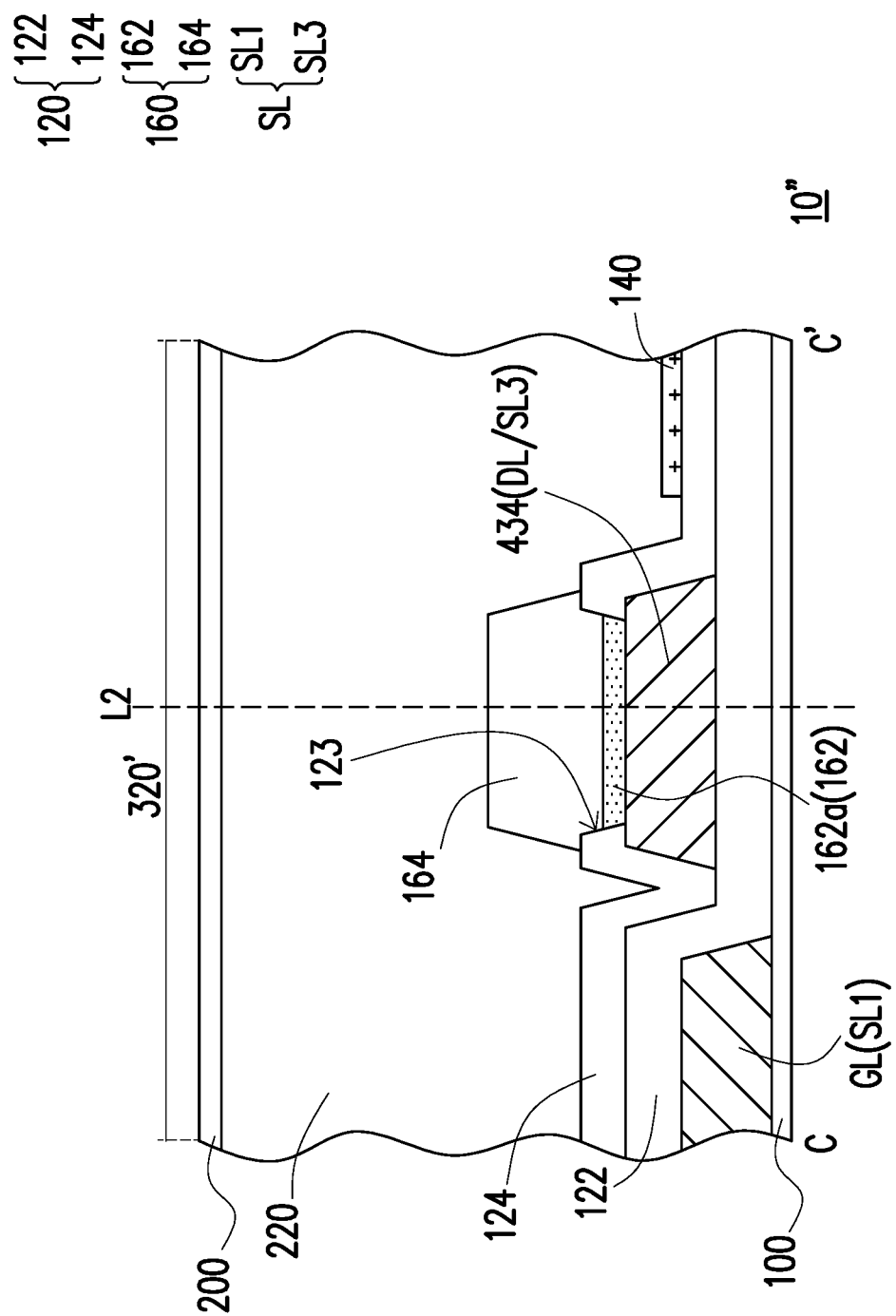
FIG. 4B is a partial sectional view illustrating the display panel in FIG. 4A taken along line C-C' before cutting.
Figure 4C:
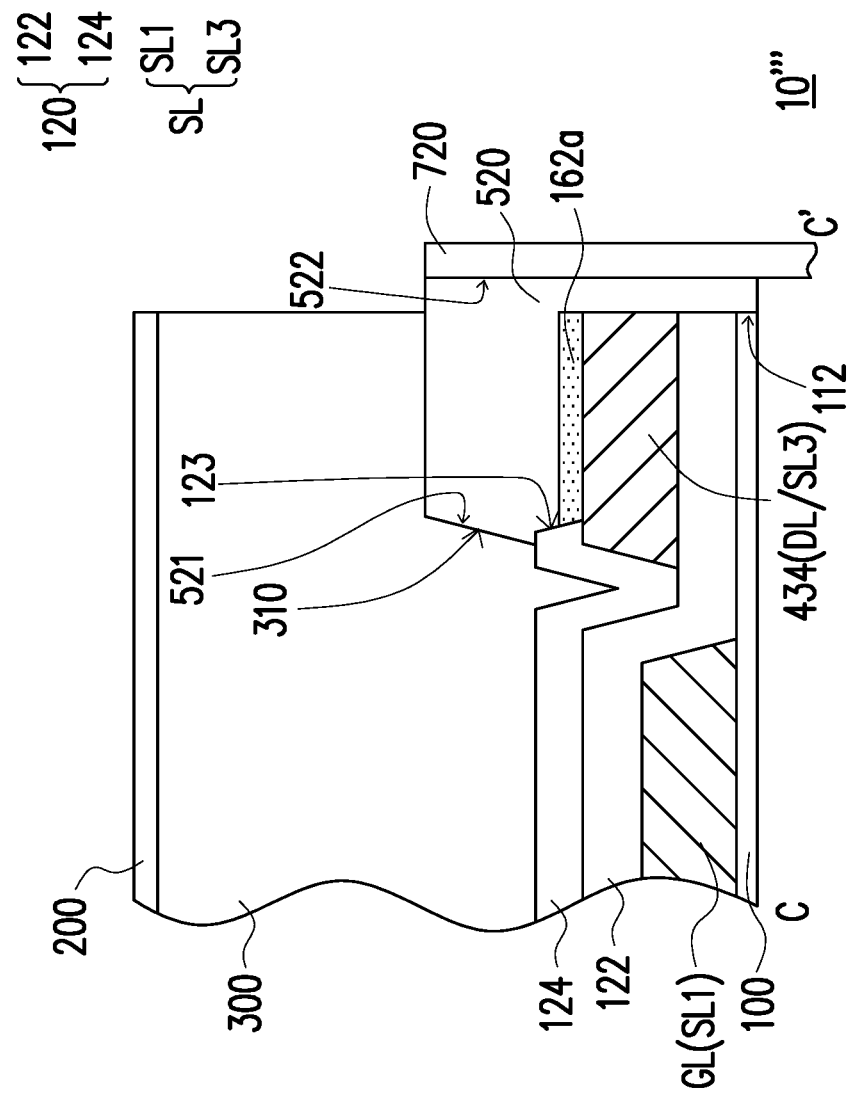
FIG. 4C is a partial sectional view illustrating the display panel in FIG. 4A taken along line C-C' after cutting.

FIG. 4A is a schematic top view illustrating a display panel according to another embodiment of the disclosure. FIG. 4B is a partial sectional view illustrating the display panel in FIG. 4A taken along line C-C' before cutting. FIG. 4C is a partial sectional view illustrating the display panel in FIG. 4A taken along line C-C' after cutting. Referring to FIG. 2A, FIG. 4A, FIG. 4B and FIG. 4C, in the embodiment, a display panel 10" in FIG. 4A is similar to the display panel 10 in FIG. 2A; please refer to the previous embodiment for reference, and no repetition is incorporated herein. The difference between the embodiment of the display panel 10" and the embodiment of the display panel 10 is that the pre-cutting line L2 of the display panel 10" and the signal line SL1 (e.g., scan line GL) may be substantially parallel with each other, and the pre-cutting line L2 is partially overlapped with an extending portion 434 of the plurality of signal lines SL3 (e.g., data line DL). In some embodiments, the pre-cutting line L2 may be disposed between two adjacent signal lines SL, for example, the pre-cutting line L2 may be disposed between the signal line SL1 (e.g., scan line GL) and the signal line SL2 (e.g., common electrode line CL), which should not be construed as a limitation to the disclosure. In other embodiments, it is optional that there may be no signal line SL2 (e.g., common electrode line CL) included between the two adjacent signal lines SL. In some embodiments, another embodiment of the disclosure may be selectively adopted in the previous embodiment such that the size of the display panel can be freely adjusted depending on the need.

In the embodiment, the plurality of sub-pixels 400 are disposed on the first substrate 100 and the plurality of sub-pixels 400 are arranged into at least two lines, for example: at least a first line of sub-pixels PX1" and at least a second line of sub-pixels PX2". One of the two lines of sub-pixels (e.g., the first line of sub-pixels PX1") may be disposed outside another of the at least two lines of sub-pixels (e.g., the second line of sub-pixels PX2"), which should not be construed as a limitation to the disclosure. As the display panel 10" before cutting shown in FIG. 4B, the first line of sub-pixels PX1" and the second line of sub-pixels PX2" may be substantially the same, for example, at least one sub-pixel 400 includes the at least one auxiliary electrode 162 which corresponds to the at least one via hole 123. Therefore, the sectional structure of a portion of the first line of sub-pixels PX1" may serve as reference for the sectional structure of a portion of the second line of sub-pixels PX2" of the display panel 10" before cutting. For example, at least one first auxiliary electrode 162a of the at least one sub-pixel 400 of the first line of sub-pixels PX1" corresponds to the at least one via hole 123 of the at least one sub-pixel 400 of the first line of sub-pixels PX1", and at least one second auxiliary electrode 162b of the at least one sub-pixel 400 of the second line of sub-pixels PX2" corresponds to the at least one via hole 123 of the at least one sub-pixel 400 of the second line of sub-pixels PX2". A plurality of spacers 164 are disposed on the first substrate 100 and also disposed on the at least one first auxiliary electrode 162a and the at least one second auxiliary electrode 162b, respectively. Additionally, the plurality of via holes 123 may be disposed in corresponding to the signal line SL or SL3 (e.g., data line DL).

Next, after the re-sizing process is performed on the display panel 10", as the display panel 10''' after cutting shown in FIG. 4C, the at least one line of sub-pixel 400 of the at least two lines of sub-pixels PX1", PX2" partially overlapped with the pre-cutting line L2, for example, the first line of sub-pixels PX1", may undergo the process of filling the sealant 300 in another sealant predetermined area 320' after the cutting, and then undergo removing (e.g., polishing) process (not shown). Therefore, the second line of sub-pixels PX2 still have the display medium layer 220 which serves as the display frame (or namely display image), and the first line of sub-pixels PX1 do not serve as the display frame. Thereafter, with the fluid removing (e.g., acid solution etching (not shown)) process, the spacer 164 of the first line of sub-pixels PX1" is removed, and the portion of signal line SL or SL3 (e.g., data line DL) only exposed by the via hole 123, the first auxiliary electrode 162a corresponding to the signal line SL or SL3 (e.g., data line DL) are retained. The space 340 exists between the portion of surface 310 in the sealant 300 (e.g., a portion of lower surface of sealant) and the first auxiliary electrode 162a. In some embodiment, the space 340 may include a portion of the via hole 123, which should not be construed as a limitation to the disclosure. In this manner, the side electrode 520 may be filled into the space 340 and cover the corresponding auxiliary electrode 162 (e.g., first auxiliary electrode 162a) to electrically connect the signal line SL or SL3 (e.g., data line DL) to the contact electrode 720 on the circuit element 700 (shown in FIG. 5). Based on the above, the configuration of the embodiment can effectively increase the contact area of the signal line SL or SL3 (e.g., data line DL) to reduce the resistance of the signal line SL or SL3 (e.g., data line DL) connected to the circuit element 700.

Referring to FIG. 2A, FIG. 4A and FIG. 4B, in the embodiment, the signal line SL or SL3 includes the data line DL. The data line DL has a main trunk portion 432 and an extending portion 434 connected to the main trunk portion 432. The first insulating layer 120 (e.g., second sub-insulating layer 124) has at least one via hole 123. The at least one vial hole 123 corresponds to the extending portion 434. For example, the signal line SL or SL3 (e.g., data line DL) may be provided with the extending portion 434 outside of the signal line SL1 (e.g., scan line GL) the pixel electrode 140 such that the at least one via hole 123 may be correspondingly disposed on the portion of the extending portion 434, and the space of the sub-pixel 400 can be utilized completely, which should not be construed as limitation to the disclosure. In other embodiment, the via hole 123 may be correspondingly disposed on a portion of the main trunk portion 432.

Figure 5:
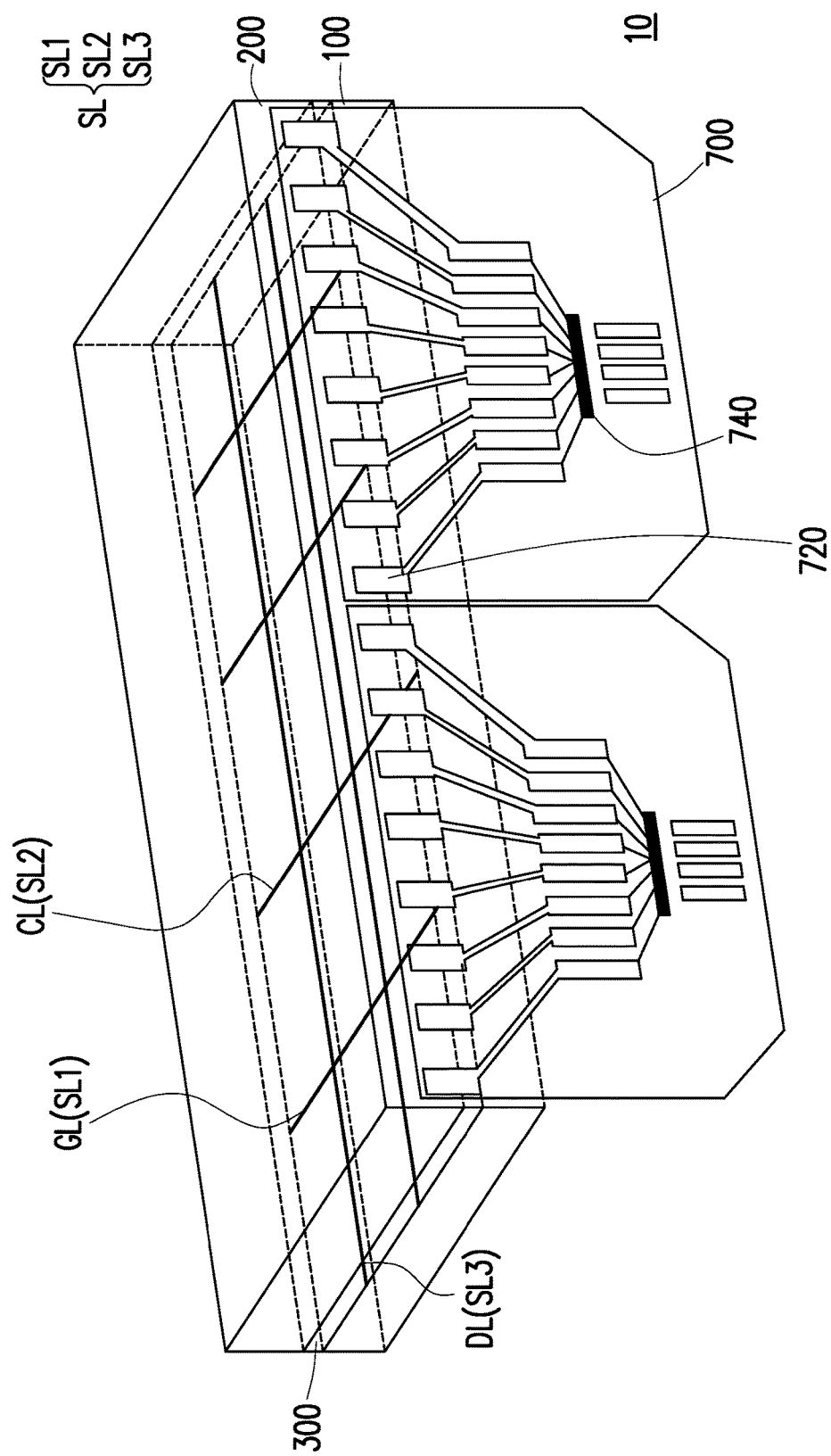
FIG. 5 is a perspective view illustrating a display panel according to another embodiment of the disclosure.

FIG. 5 is a perspective view illustrating a display panel 10 according to another embodiment of the disclosure. Referring to FIG. 5 and other drawings (e.g., FIG. 3A, FIG. 3B), in the embodiment, the circuit element 700 is, for example, a flexible printed circuit board (FPC), which should not be construed as a limitation to the disclosure. The circuit element 700 includes a connecting electrode 720 and a driving circuit 740 (e.g., driving chip). The circuit element 700 may electrically connect the connecting electrode 720 to another end 522 (or namely another portion) of the side electrode 520 on the lateral surface 112 disposed on the first substrate 100 via a conductive paste (e.g., anisotropic conductive film (ACF) or other suitable conductive paste or conductive layer). Based on the above, the circuit element 700 on the lateral side of the display panel 10 may be electrically connected to the sub-pixel 400 via the side electrode 520, such that the frame (or namely, peripheral area, e.g., non-display area) can be reduced to achieve the demand for a display panel with narrow frame or a frameless display panel. In other embodiment, the embodiment of FIG. 4C may be applied in the embodiment of FIG. 5. Alternatively, the embodiment of at least one of FIG. 3A, FIG. 3B and FIG. 4C may be applied in the embodiment of FIG. 5, please refer to previous embodiment for corresponding descriptions.

Since the auxiliary structure 160 of the sub-pixel 400 in the embodiment has the spacer 164 and the auxiliary electrode 162 corresponding to the via hole 123, when the re-sizing process is performed, after one of at least two lines of sub-pixels 400 (e.g., first line of sub-pixel PX1") is cut, the fluid (e.g., acid solution) etching process may be performed to remove the spacer 164, and the signal line SL only exposed by the via hole 123, the auxiliary electrode 162 (e.g., first auxiliary electrode 162a) corresponding to the signal line SL and the space 340 between the portion of surface of the sealant 300 and the auxiliary electrode 162 (e.g., first auxiliary electrode 162a) are retained. In some embodiments, the space 340 may include a portion of the via hole 123, which should not be construed as a limitation to the disclosure. In this manner, the side electrode 520 may be disposed on the lateral surface 112 of the first substrate 100, and the side electrode 520 may be filled into the space 340 to cover the auxiliary electrode 162 (e.g., first auxiliary electrode 162a) to electrically connect the signal line SL (e.g., at least one of the signal lines mentioned above) to the circuit element 700, thereby achieving the narrow frame or frameless requirement while increasing the contact area of the signal line SL and reducing the resistance of the signal line SL connected to external electronic element. Additionally, the disclosure allows the signal line SL to be electrically connected to the side electrode 520 after the display panel 10 is cut without configuration of additional electrode element, which increases cutting flexibility of re-sizing process. Moreover, since the plurality of auxiliary structures 160 and the corresponding plurality of via holes 123 are respectively overlapped with the pre-cutting line L1 and/or L2, the plurality of signal lines SL and the plurality of auxiliary electrodes 162 (e.g., auxiliary electrode 162a) can be exposed in the same cutting process in the disclosure, thereby reducing the manufacturing cost and simplifying the process.

It should be indicated that the following embodiments adopt the reference numerals and some descriptions used in the previous embodiment, wherein the same reference numerals are used to denote the same or similar elements. The previous embodiment may serve as reference for the omitted technical descriptions and no repetitions are incorporated in the following embodiments.

Figure 6A:
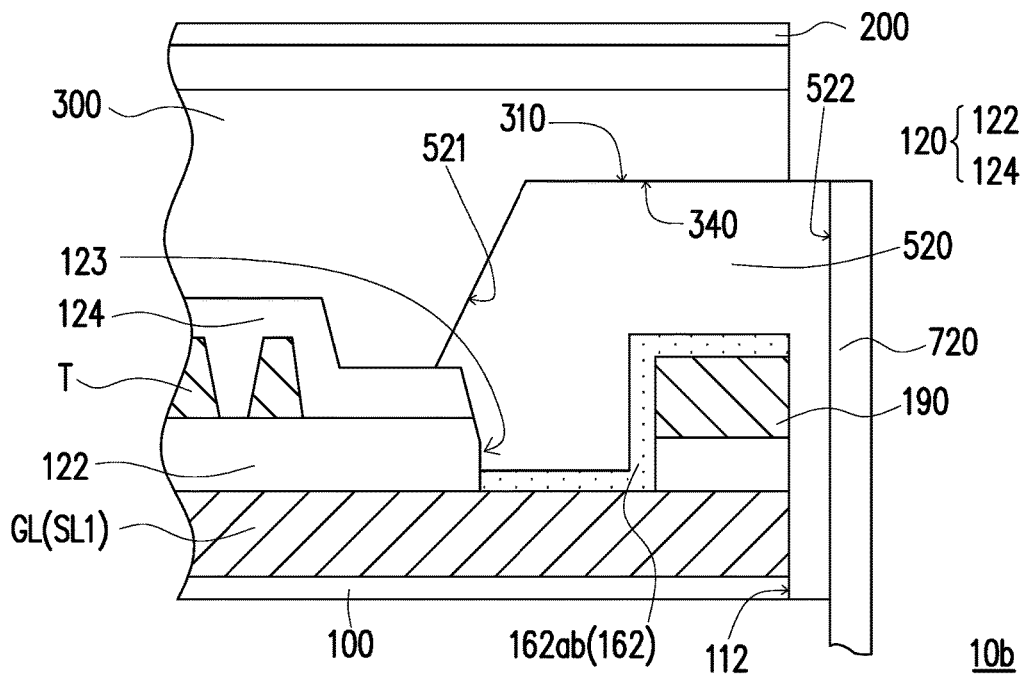
FIG. 6A is a partial sectional view illustrating a display panel after cutting according to another embodiment of the disclosure.

FIG. 6A is a partial sectional view illustrating a display panel after cutting according to another embodiment of the disclosure. Referring to FIG. 3A and FIG. 6A, a display panel 10b in the embodiment is similar to the display panel 10' in FIG. 3A, and the difference between the two is that an auxiliary structure 160b in the embodiment further includes at least one conductive structure 190. The conductive structure 190 may be disposed between the first substrate 100 and a first auxiliary electrode 162ab as well as the first substrate 100 and the second auxiliary electrode (not shown). The conductive structure 190 is respectively partially overlapped with the at least one first signal line SL1 corresponding to the sub-pixel 400 in the first line of sub-pixels PX1 and the second line of sub-pixels PX2. For example, the conductive structure 190 is disposed on the first insulating layer 120 (e.g., first sub-insulating layer 122) and separated from the first signal line SL1. In the sub-pixels PX1 of the first line, the first auxiliary electrode 162ab is partially overlapped with the conductive structure 190 and the signal line SL1 respectively, and in the sub-pixels PX2 of the second line, the second auxiliary electrode (not shown) is partially overlapped with the conductive structure 190 and the signal line SL1 respectively. The plurality of via holes 123 of the display panel 10b may expose a portion of the plurality of conductive structures 190 and a portion of the signal line SL1 respectively. The first auxiliary electrode 162ab along with the conductive structure 190 and the signal line SL1 may be formed into a step-like shape, and the space 340 exists between the portion of surface 310 of the sealant 300 (e.g., a portion of lower surface of sealant) and the first auxiliary electrode 162ab. In some embodiments, the space 340 may include a portion of the via hole 123, which should not be construed as a limitation to the disclosure. In the embodiment, the signal line SL1 may be, for example, a scan line GL, but the disclosure provides no limitation thereto. With the conductive structure 190, the area of the first auxiliary electrode 162ab may be further increased, and thus the contact area of the first signal line SL for external electrical connection can be further increased; as a result, the resistance is further decreased to avoid display malfunction and improve display quality. Moreover, by forming the first auxiliary electrode 162ab along with the conductive structure 190 and the signal line SL1 into the step-like shape, the electrical connection stability of the side electrode 520 and the signal line SL1 can be increased, such that the display quality can be enhanced.

Figure 6B:
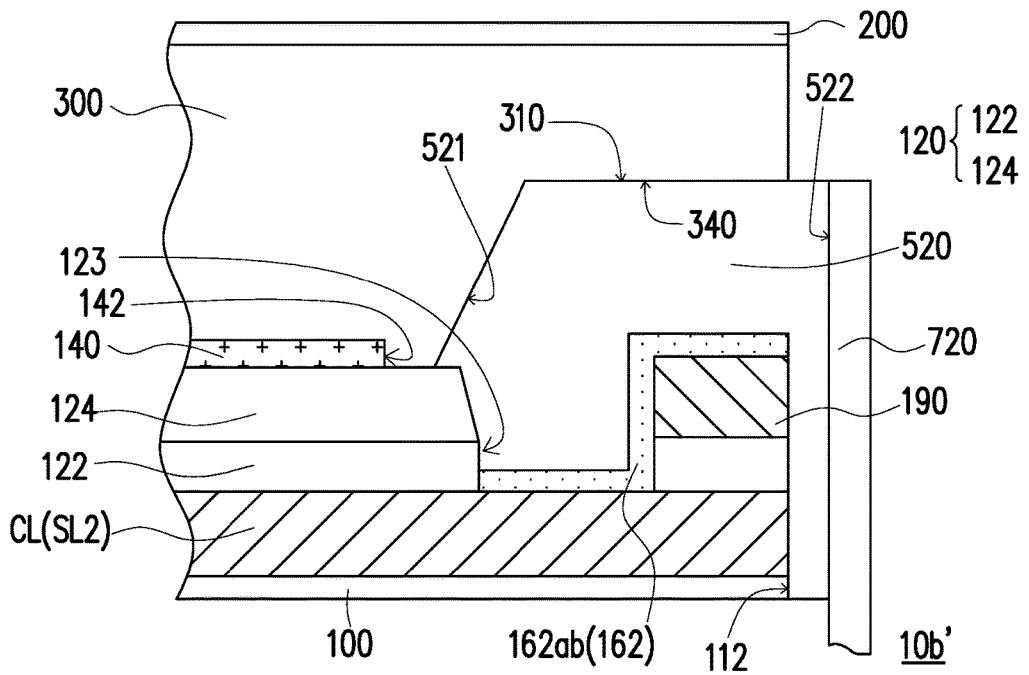
FIG. 6B is a partial sectional view illustrating a display panel after cutting according to another embodiment of the disclosure.

FIG. 6B is a partial sectional view illustrating a display panel after cutting according to another embodiment of the disclosure. Referring to FIG. 6A and FIG. 6B, a display panel 10b' in the embodiment is similar to the display panel 10b in FIG. 6A, and the difference between the two is that the conductive structure 190 in the embodiment is partially overlapped with the at least one second signal line SL2 of the sub-pixels PX2" in the sub-pixels PX1" of the first line and the sub-pixels PX2" of the second line respectively. For example, in the sub-pixels PX1 of the first line, the first auxiliary electrode 162ab is partially overlapped with the conductive structure 190 and the second signal line SL2 respectively, and in the sub-pixels PX2 of the second line, the second auxiliary electrode (not shown) is partially overlapped with the conductive structure 190 and the signal line SL2 respectively. A plurality of openings 142 of the display panel 10b' corresponding to the plurality of via holes 123 can expose a portion of the plurality of conductive structures 190 and a portion of the signal line SL2. In the embodiment, the signal line SL2 may be, for example, a common electrode line CL, which should not be construed as a limitation to the disclosure.

Figure 6C:
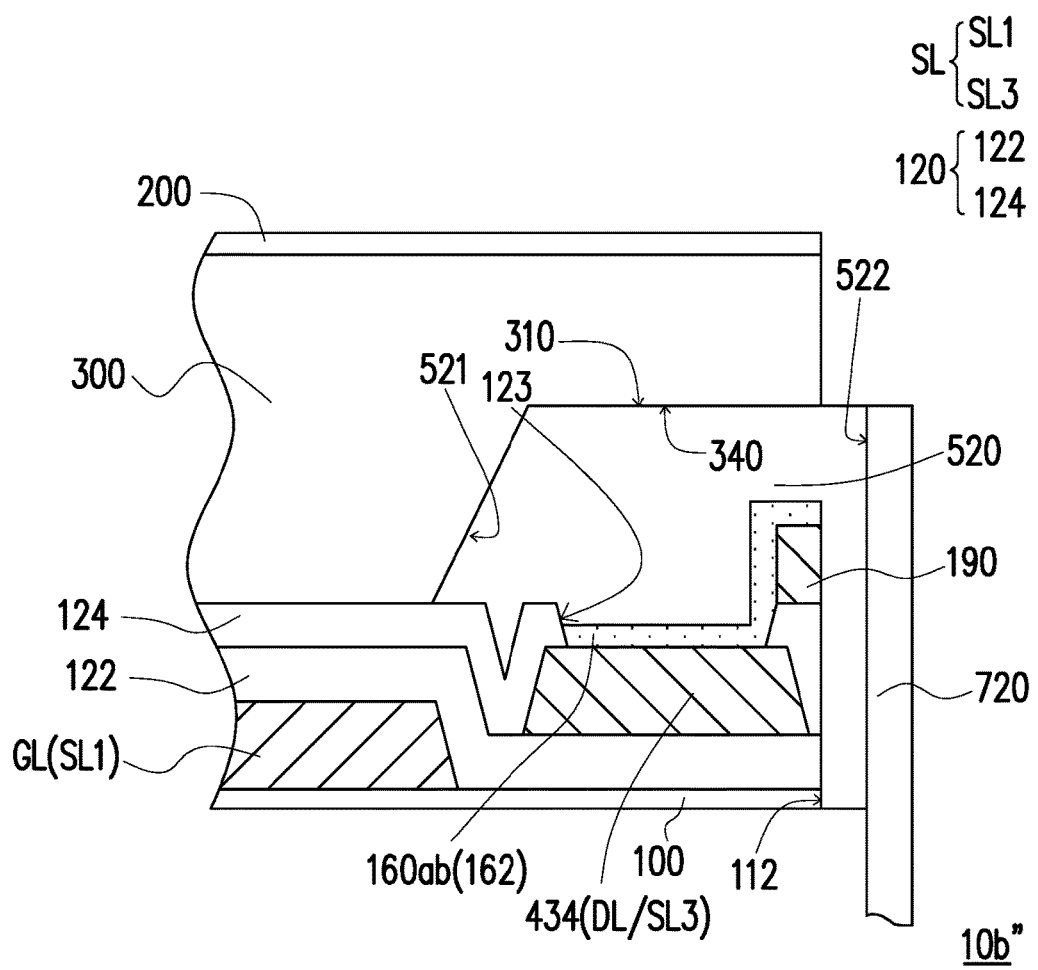
FIG. 6C is a partial sectional view illustrating a display panel after cutting according to another embodiment of the disclosure.

FIG. 6C is a partial sectional view illustrating a display panel after cutting according to another embodiment of the disclosure. Referring to FIG. 4C, FIG. 6A and FIG. 6C, a display panel 10b" in the embodiment is similar to the display panel 10b in FIG. 6A, and the difference between the two is that the conductive structure 190 in the embodiment is partially overlapped with the at least one signal line SL or SL3 in the sub-pixels PX1" of the first line and in the sub-pixels PX2" of the second line respectively, and the signal line SL or SL3 may, for example, include data line DL. For example, in the sub-pixels PX1" of the first line, the first auxiliary electrode 162ab is partially overlapped with the conductive structure 190 and the signal line SL or SL3 respectively, and in the sub-pixels PX2" of the second line, the second auxiliary electrode (not shown) is partially overlapped with the conductive structure 190 and the signal line SL or SL3 respectively. The first insulating layer 120 (e.g., second sub-insulating layer 124) has at least one via hole 123. The at least one via hole 123 corresponds to the at least one signal line SL or SL3. The plurality of via holes 123 of the display panel 10b" may expose a portion of the plurality of conductive structures 190 and a portion of the signal line SL respectively. Furthermore, at least one of the conductive structure 190 and the signal line SL (e.g., scan line GL, common electrode line CL, data line DL or other suitable line) designed in the embodiment of the disclosure may be applied in the previous embodiment; please refer to the previous embodiments for related descriptions. Additionally, at least one of the embodiments of FIG. 6A-FIG. 6C may be applied to the display panel of the disclosure.

Since the first auxiliary electrode 162ab in each of the sub-pixels PX1 and PX1" of the first line is partially overlapped with the conductive structure 190 and the plurality of signal lines SL (e.g., scan line GL, common electrode line CL, data line DL or other suitable line), the area of the first auxiliary electrode 162ab can be effectively increased, and thus the contact area of the plurality of signal lines SL (e.g., scan line GL, common electrode line CL, data line DL or other suitable line) correspondingly overlapped with the first auxiliary electrode 162ab and the side circuit 520 is increased as well. In the configuration of the embodiment, the resistance of the electrical contact between the circuit element 700 and the signal line SL (e.g., scan line GL, common electrode line CL, data line or other suitable line) can be further reduced to avoid display malfunction and the display quality can be enhanced as well.

It should be indicated that the following embodiments adopt the reference numerals and some descriptions used in the previous embodiment, wherein the same reference numerals are used to denote the same or similar elements. The previous embodiment may serve as reference for the omitted technical descriptions and no repetitions are incorporated in the following embodiments.

Figure 7:
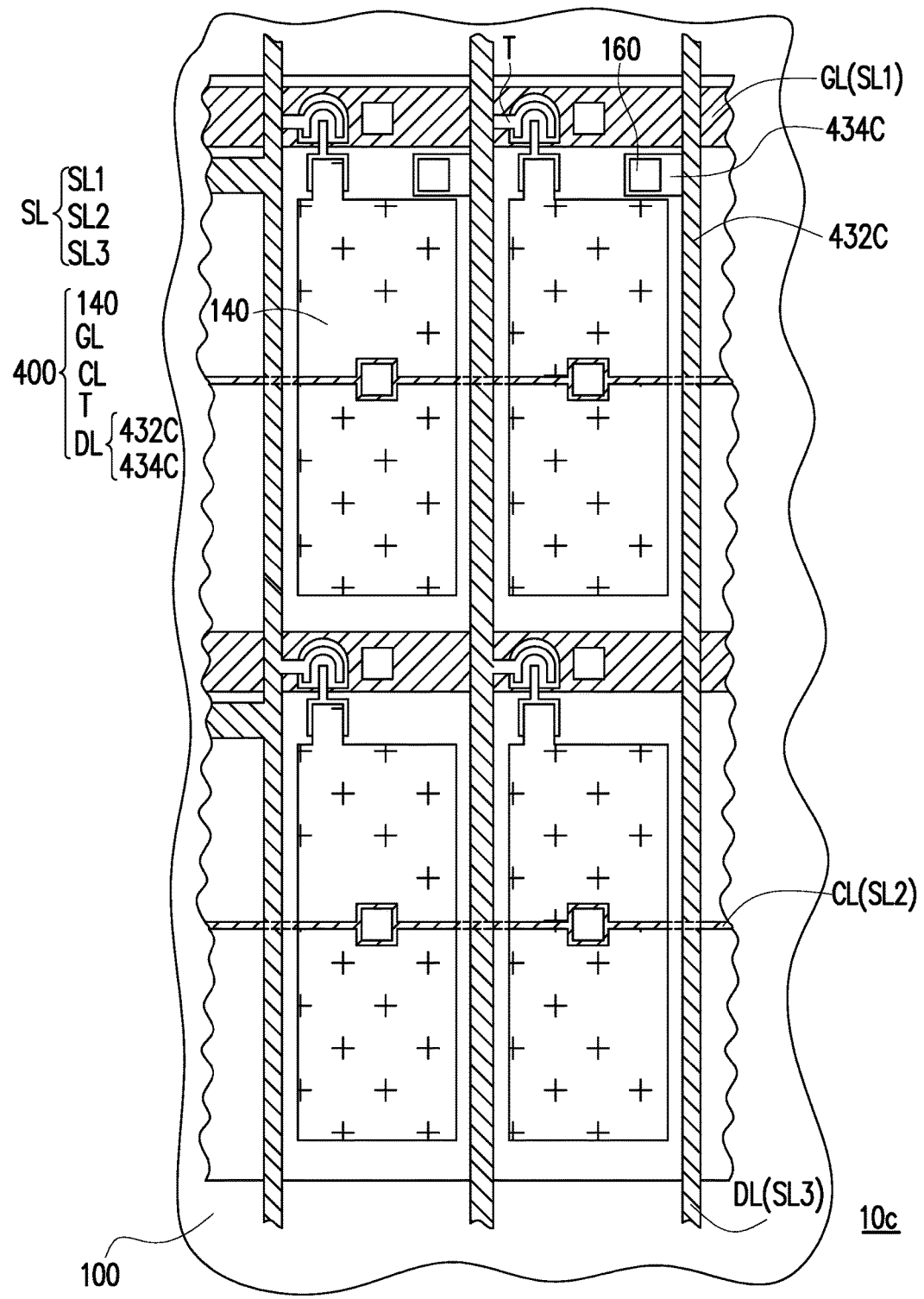
FIG. 7 is a schematic top view illustrating a display panel according to another embodiment of the disclosure.

FIG. 7 is a schematic top view illustrating a display panel according to another embodiment of the disclosure. Referring to FIG. 2A and FIG. 7, a display panel 10c in the embodiment is similar to the display panel 10 in FIG. 2A, and the main difference between the two is that one of the two adjacent sub-pixels 400 in the same line includes an extending portion 434C connected to the main trunk portion 432C. For example, the plurality of sub-pixels 400 are at least divided into two lines of sub-pixels 400, and the same line of sub-pixels have a plurality of sub-pixels 400 adjacent to each other. The data line DL has a plurality of extending portion 434C disposed in corresponding to the sub-pixel 400, and the signal lines SL (e.g., signal line SL3 may include data line DL) of one of the two adjacent sub-pixels 400 of the same line includes the extending portion 434C. In other words, the extending portion 434C is disposed by every one other column or every one other row. Based on the above, the configuration of the embodiment may be optionally provided with an auxiliary structure (not shown) in the extending portion 434C in a specific column or row of all sub-pixels 400, and thus the opening rate of the display panel 10c can be effectively imported and the display quality can be enhanced as well; however, the disclosure is not limited thereto. In other embodiments, the extending portion 434C and the corresponding auxiliary structure 160 may be provided in each column of sub-pixel.

In the previously described exemplary embodiments, the term "line" includes column, row or other suitable arrangement, or a combination of the at least two directions. The number of each line described in the previous exemplary embodiments may be at least one. In the previous embodiment, the shape of at least one of the space 340, the via hole 123, the opening 142, the spacer 164, the auxiliary electrode 162 and the conductive structure 192 may be polygonal shape such as quadrilateral shape, circular shape, oval shape or other suitable shapes. In the previous exemplary embodiment, one via hole 123 may correspond to at least one auxiliary structure 160, or that at least one via hole 123 may correspond to one auxiliary structure 160, or that at least one via hole 123 may correspond to at least one auxiliary structure 160. In the previous exemplary embodiment, the element related to the sub-pixel 400 (e.g., at least one signal line SL, transistor T and so on) is disposed on the inner surface of the first substrate 100, and the lateral surface 112 in the previous embodiment is connected to the outer surface and inner surface of the first substrate 100, and the lateral surface 112 is a surface different from the inner surface and the outer surface (e.g., or referred to as different plane). At least one of the previous embodiments may be applied in the display panel of the disclosure, and the position of the plurality of signal lines SL in the sub-pixel 400 described in the previous exemplary embodiment may be switched, or the pixel electrode 140 may be disposed in vertical, horizontal manner or other suitable manner.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display panel, comprising:
a first substrate;
a plurality of sub-pixels, disposed on the first substrate, and the sub-pixels arranged into at least two lines, wherein the at least one sub-pixel in each of the lines comprises:
at least one transistor;

at least one signal line, electrically connected to the at least one transistor, wherein the at least one signal line comprises at least one of a data line, a scan line, a common electrode line and a power supply line;
a first insulating layer, disposed on the at least one transistor and the signal line, and the first insulating layer having at least one via hole, wherein the at least one via hole corresponds to the signal line;
a pixel electrode, disposed on the first substrate, and electrically connected to the at least one transistor; and
at least one auxiliary structure, disposed on the first substrate, and the at least one auxiliary structure corresponding to the at least one via hole, wherein the at least one auxiliary structure comprises:
at least one auxiliary electrode, disposed on the first substrate, and at least a portion of the auxiliary electrode disposed in the at least one via hole; and
at least one spacer, disposed on the first substrate, and the spacer being disposed on the at least one auxiliary electrode;
a second substrate, disposed opposite to the first substrate; and
a sealant, disposed between the first substrate and the second substrate, wherein the display panel has a pre-cutting line, and the pre-cutting line passes through the sub-pixels of at least one of the two lines.

2. The display panel according to claim 1, wherein the at least one signal line comprises the data line, and has a main trunk portion and an extending portion connected to the main trunk portion, the at least one via hole corresponds to the extending portion.

3. The display panel according to claim 1, wherein the at least one auxiliary structure further comprises at least one conductive structure, the conductive structure is disposed between the first substrate and the auxiliary electrode, the conductive structure is partially overlapped with the at least one signal line, the auxiliary electrode is partially overlapped with the conductive structure and the at least one signal line, and the via hole exposes a portion of the conductive structure and a portion of the at least one signal line respectively.

4. The display panel according to claim 1, further comprising another sealant having a predetermined area, disposed in a portion of at least one of the two lines of sub-pixels where the pre-cutting line passes through.

5. The display panel according to claim 1, wherein the pixel electrode further comprises at least one opening, and the at least one signal line comprises the common electrode line, wherein the at least one opening corresponds to a portion of the at least one via hole.

6. The display panel according to claim 1, wherein the at least one signal line comprises the scan line and the common electrode line, in a direction of the pre-cutting line, the at least one auxiliary structure and the at least one via hole are respectively many, and the auxiliary electrodes respectively disposed on the common electrode line and the scan line are at least partially overlapped.

7. The display panel according to claim 1, further comprising at least one photo-spacer disposed between the first substrate and the second substrate.

8. A display panel, comprising:
a first substrate;
a plurality of sub-pixels, disposed on the first substrate, the sub-pixels arranged into at least one first line and one second line, and the first line disposed between the second line and a lateral surface of the first substrate, wherein the at least one sub-pixel of each of the first line and the second line comprises:
at least one transistor;
at least one first signal line and at least one second signal line, electrically connected to the at least one transistor respectively;
a first insulating layer, disposed on the at least one transistor and the at least one first signal line as well as the at least one second signal line, and the first insulating layer having a plurality of via holes respectively corresponding to the at least one first signal line and the at least one second signal line; and
at least one pixel electrode, disposed on the first substrate, and electrically connected to the at least one transistor;
a plurality of first auxiliary electrodes, disposed on the at least one of the first line of sub-pixels, and the first auxiliary electrodes respectively corresponding to the via holes of the at least one of the first line of sub-pixels;
a plurality of auxiliary structures, disposed on the at least one of the second line of sub-pixels, and the auxiliary structures respectively corresponding to the via holes of the at least one of the second line of sub-pixels, wherein each of the auxiliary structures comprises:
at least one second auxiliary electrode, disposed on the first substrate, and the second auxiliary electrode disposed in the corresponding via hole; and
at least one spacer, disposed on the first substrate, and the spacer being disposed on the at least one second auxiliary electrode;
a second substrate, disposed opposite to the first substrate;
a sealant, disposed between the first substrate and the second substrate, and the sealant and the first line of the sub-pixels being partially overlapped, and a surface of the sealant and the first auxiliary electrodes of the at least one of the first line of sub-pixels forming a plurality of spaces respectively; and
a plurality of side electrodes, disposed on the lateral surface of the first substrate, wherein an end of the side electrodes is extended to the spaces respectively and covers the first auxiliary electrodes respectively, another end of the side electrodes is electrically connected to at least one circuit element.

9. The display panel according to claim 8, wherein the at least one first signal line comprises a scan line, the at least one second signal line comprises at least one common electrode line.

10. The display panel according to claim 8, wherein the pixel electrode of the at least one sub-pixel of each of the lines further comprises at least one opening and disposed on the at least one sub-pixel in the first line and the second line, the openings respectively correspond to the via holes on the second signal lines.

11. The display panel according to claim 8, further comprising a plurality of conductive structures, being disposed between the first substrate and the first auxiliary electrodes, and disposed between the first substrate and the second auxiliary electrodes, the conductive structures being partially overlapped with the at least one first signal line and the at least one second signal line disposed on the at least one sub-pixel in the first line and the second line respectively, wherein the first auxiliary electrode are respectively partially overlapped with one of the conductive structures, the first signal line and the second signal line in the at least one sub-pixel of the first line, the second auxiliary electrodes are respectively partially overlapped with the conductive structures, the first signal line and the second signal line in the at least one sub-pixel of the second line, and the via holes respectively expose a portion of the conductive structures, a portion of the first signal line and a portion of the second signal line.

12. The display panel according to claim 8, wherein that the at least one sub-pixel of each of the lines further comprises at least one third signal line, and the via holes further respectively correspond to the third signal lines.

13. The display panel according to claim 12, wherein the at least one third signal line comprises a data line.

14. The display panel according to claim 12, further comprising a plurality of conductive structures, being disposed between the first substrate and the first auxiliary electrodes, and disposed between the first substrate and the second auxiliary electrodes, the conductive structures are partially overlapped with the third signal line disposed on the at least one sub-pixel of the first line and the second line respectively, wherein one of the first auxiliary electrodes are partially overlapped with one of the conductive structures and the third signal line in the at least one sub-pixel of the first line, one of the second auxiliary electrodes are partially overlapped with one of the conductive structures and the third signal line in the at least one sub-pixel of the second line, and the via holes respectively expose a portion of the conductive structures and a portion of the third signal line.

15. The display panel according to claim 12, wherein each of the third signal lines has a main trunk portion and an extending portion connected to the main trunk portion, the via holes respectively correspond to the extending portions.

16. The display panel according to claim 8, further comprising at least one photo-spacer disposed between the first substrate and the second substrate.

17. A display panel, comprising:
a first substrate;
a plurality of sub-pixels, disposed on the first substrate, the sub-pixels arranged into at least one first line and one second line, and the first line being disposed between the second line and a lateral surface of the first substrate, wherein the least one sub-pixels of each of the first line and the second line comprises:
at least one transistor;
at least one signal line, electrically connected to the at least one transistor, wherein the signal line comprises at least one of a data line, a scan line, a common electrode line and a power supply line;
a first insulating layer, disposed on the at least one transistor and the signal line, and the first insulating layer having at least one via hole corresponding to the signal line; and
at least one pixel electrode, disposed on the first substrate, and electrically connected to the at least one transistor;
at least one first auxiliary electrode, disposed on the at least one sub-pixel in the first line, and the at least one first auxiliary structure corresponding to the at least one via hole of the at least one sub-pixel of the first line;
at least one auxiliary structure, disposed on the at least one sub-pixel in the second line, and the at least one auxiliary structure corresponding to the at least one via hole of the at least one sub-pixel in the second line, wherein the at least one auxiliary structure comprises:
at least one second auxiliary electrode, disposed on the first substrate, and the second auxiliary electrode disposed in the corresponding via hole; and
at least one spacer, disposed on the first substrate, and the spacer disposed on the at least one second auxiliary electrode;
a second substrate, disposed opposite to the first substrate;
a sealant, disposed between the first substrate and the second substrate, and the sealant being partially overlapped with the sub-pixels in the first line, and a surface of the sealant and the at least one first auxiliary electrode on the at least one sub-pixel in the first line forming a space; and
at least one side electrode, disposed on the lateral surface of the first substrate, wherein an end of the side electrode is extended into the space and covers the first auxiliary electrode, and another end of the side electrode is electrically connected to at least one circuit element.

18. The display panel according to claim 17, wherein the at least one signal line comprises the data line.

19. The display panel according to claim 17, further comprising a plurality of conductive structures, being disposed between the first substrate and the first auxiliary electrode, and being disposed between the first substrate and the second auxiliary electrode, the conductive structures are partially overlapped with the signal line of the at least one sub-pixel in the first line and the second line respectively, wherein the first auxiliary electrode is partially overlapped with one of the conductive structures and the signal line in the at least one sub-pixel of the first line, the second auxiliary electrode is partially overlapped with one of the conductive structures and the signal line in the at least one sub-pixel of the second line, and the via holes expose a portion of the conductive structures and a portion of the signal line respectively.

20. The display panel according to claim 17, wherein each of the signal lines has a main trunk portion and an extending portion connected to the main trunk portion, the via holes respectively correspond to the extending portions.

21. The display panel according to claim 17, further comprising at least one photo-spacer disposed between the first substrate and the second substrate.

* * * * *